United States Patent [19]
Foote et al.

[11] Patent Number: 6,046,398
[45] Date of Patent: Apr. 4, 2000

[54] MICROMACHINED THERMOELECTRIC SENSORS AND ARRAYS AND PROCESS FOR PRODUCING

[75] Inventors: Marc C. Foote, La Crescenta; Eric W. Jones, Los Angeles; Thierry Caillat, Pasadena, all of Calif.

[73] Assignee: The United States of America as represented by the Administrator of the National Aeronautics and Space Administration, Washington, D.C.

[21] Appl. No.: 09/190,416

[22] Filed: Nov. 4, 1998

[51] Int. Cl.$^7$ ..................................................... H01L 35/00
[52] U.S. Cl. ........................ 136/201; 136/224; 136/236.1
[58] Field of Search .................... 136/224, 227, 136/242, 201, 204, 205; 252/62.3 T

[56] References Cited

U.S. PATENT DOCUMENTS

| | | | |
|---|---|---|---|
| 3,071,495 | 1/1963 | Hänlein | 117/212 |
| 3,354,309 | 11/1967 | Volkovisky | 250/83 |
| 3,483,045 | 12/1969 | Villers | 136/225 |
| 4,036,665 | 7/1977 | Barr et al. | 136/202 |
| 4,054,478 | 10/1977 | Linnon | 156/242 |
| 4,098,617 | 7/1978 | Lidorenko et al. | 148/1.5 |
| 4,558,342 | 12/1985 | Sclar | 357/30 |
| 4,772,790 | 9/1988 | Aldridge | 250/343 |
| 4,786,335 | 11/1988 | Knowles et al. | 136/214 |
| 4,859,250 | 8/1989 | Buist | 136/225 |
| 4,964,735 | 10/1990 | Sasnett et al. | 374/32 |
| 5,045,123 | 9/1991 | Hattori et al. | 136/213 |
| 5,059,543 | 10/1991 | Wise et al. | 437/3 |
| 5,374,123 | 12/1994 | Bu | 374/109 |
| 5,594,248 | 1/1997 | Tanaka | 250/332 |
| 5,689,087 | 11/1997 | Jack | 136/213 |

FOREIGN PATENT DOCUMENTS

| | | |
|---|---|---|
| 1064537 | 4/1958 | Germany . |
| 1639502 | 11/1969 | Germany . |
| 0022675 | 1/1986 | Japan . |
| 1006835 | 10/1965 | United Kingdom . |

OTHER PUBLICATIONS

Tajima etal; "The Design Of Thin–Film Thermoelements For High–Frequency Power Measurements"; Electron and Commun.; Japan; vol. 53, No. 7; Jul. 1970; pp. 24–25.

Fuschillo etal; "Transport Properties Of The Pseudo–Binary Alloy System $Bi_2Te_{3-y}Se_y$"; Journal Physical Chemical Solids; Pergamon Press; 1959; vol. 8; pp. 430–433, No Month Given.

(List continued on next page.)

*Primary Examiner*—Kathryn Gorgos
*Assistant Examiner*—Thomas H. Parsons
*Attorney, Agent, or Firm*—John H. Kusmiss

[57] ABSTRACT

Linear arrays with up to 63 micromachined thermopile infrared detectors on silicon substrates have been constructed and tested. Each detector consists of a suspended silicon nitride membrane with 11 thermocouples of sputtered Bi—Te and Bi—Sb—Te thermoelectric elements films. At room temperature and under vacuum these detectors exhibit response times of 99 ms, zero frequency D* values of $1.4 \times 10^9$ cmHz$^{1/2}$/W and responsivity values of 1100 V/W when viewing a 1000 K blackbody source. The only measured source of noise above 20 mHz is Johnson noise from the detector resistance. These results represent the best performance reported to date for an array of thermopile detectors. The arrays are well suited for uncooled dispersive point spectrometers. In another embodiment, also with Bi—Te and Bi—Sb—Te thermoelectric materials on micromachined silicon nitride membranes, detector arrays have been produced with D* values as high as $2.2 \times 10^9$ cmHz$^{1/2}$/W for 83 ms response times.

55 Claims, 16 Drawing Sheets

OTHER PUBLICATIONS

"Bismuth Telluride Improvement Program Literature Study"; Jun. 1964; Thermoelectric Div. General Instrument Corp. Contract At (30–1)–3362 US Atomic Energy Commission; pp. 1–2.

Lahiji etal; "A Batch–Fabricated Silicon Thermopile Infrared Detector"; IEEE Transactions On Electron Devices; vol. ED 29, No. 1; Jan. 1982; pp. 14–22.

Airapetiants etal; "Brief Communications"; Soviet Physics–Tech Phys.; vol. 2(9); 1957; pp. 2009–2011. No Month Given.

E. Kessler et al. "A 256 pixel linear thermopile array using materials with high thermoelectric efficiency", Proceedings of the 16th International Conference on thermoelectrics, 1997, pp. 734–777. No Month Given.

MICROMACHINED THERMOELECTRIC SENSORS AND ARRAYS AND PROCESS FOR PRODUCING

ORIGIN OF INVENTION

The invention described herein was made in the performance of work under a NASA Contract, and is subject to the provisions of Public Law 96-517 (35 USC 202) in which the Contractor has elected not to retain title.

BACKGROUND OF THE INVENTION

For persons desiring more detail in the background of the technology, the following references, noted by a pair of { } brackets, are placed at relevant locations hereinafter:

{Ref. 1} R. A. Wood, "Uncooled thermal imaging with monolithic silicon focal planes", Proc. SPIE Vol. 2020, Infrared Technology XIX, 1993, pp. 322–329.

{Ref. 2} C. Hanson, "Uncooled thermal imaging at Texas Instruments", Proc. SPIE Vol. 2020, Infrared Technology XIX, 1993, pp. 330–339.

{Ref. 3} I. H. Choi and K. D. Wise, "A Silicon-Thermopile-Based Infrared Sensing Array for Use in Automated Manufacturing", IEEE Transactions on Electron Devices, vol. ED-33, pp. 72–79, January 1986.

{Ref. 4} W. G. Baer, K. Najafi, K. D. Wise and R. S. Toth, "A 32-element micromachined thermal imager with on-chip multiplexing", Sensors and Actuators A, vol. 48, pp. 47–54, 1995.

{Ref. 5} P. M. Sarro, H. Yashiro, A. W. v. Herwaarden and S. Middelhoek, "An Integrated Thermal Infrared Sensing Array", Sensors and Actuators, vol. 14, pp. 191–201, 1988.

{Ref. 6} T. Kanno, M. Saga, S. Matsumoto, M. Uchida, N. Tsukamoto, A. Tanaka, S. Itoh, A. Nakazato, T. Endoh, S. Tohyama, Y. Yamamoto, S. Murashima, N. Fujimoto, and N. Teranishi, "Uncooled infrared focal plane array having 128× 128 thermopile detector elements", Proc. SPIE Vol. 2269, Infrared Technology XX, 1994, pp. 450–459.

{Ref. 7} Andrew D. Oliver, Wayne G. Baer, and Kensall D. Wise, "A Bulk-Micromachined 1024-Element Uncooled Infrared Imager", The 8th International Conference on Solid State Sensors and Actuators (Transducers '95), and Eurosensors IX, 1995, pp. 636–639.

{Ref. 8} A. W. van Herwaarden, "The Seebeck Effect in Silicon ICs", Sensors and Actuators, vol. 6, pp. 245–254, 1984.

{Ref. 9} R. Lenggenhager, H. Baltes, J. Peer and M. Forster, "Thermoelectric Infrared Sensors by CMOS Technology", IEEE Electron Device Letters, vol. 13, pp. 454–456, September 1992.

{Ref. 10} M. von Arx, 0. Paul, and H. Baltes, "Test Structures to Measure the Seebeck Coefficient of CMOS IC Polysilicon", Proceedings of the 1996. IEEE International Conference on Microelectronic Test Structures, vol. 9, March 1996, pp. 117–122.

{Ref. 11} R. Lenggenhagger, H. Baltes and T. Elbel, "Thermoelectric infrared sensors in CMOS technology", Sensors and Actuators A, vol. 37–38, pp. 216–220, 1993.

{Ref. 12} D. F. Hornig and B. J. O'Keefe, "The Design of Fast Thermopiles and the Ultimate Sensitivity of Thermal Detectors", The Review of Scientific Instruments, vol. 18, pp. 474–482, July 1947.

{Ref. 13} R. A. Wood, T. M. Rezachek, P. W. Kruse and R. N. Schmidt, "IR SnapShotTM Camera", Proc. SPIE Vol. 2552, Infrared Technology XXI, 1995, pp. 654–660.

{Ref. 14} M. L. Wilson, D. Kubisiak, R. A. Wood, J. A. Ridley and M. Listvan, "An Uncooled Thermo-Electric Microthermopile Camera Developed Using Silicon Microstructure Detectors", Proc. IRIS Specialty Group on Infrared Detectors, vol. II, 13–16, August 1991, pp. 215–225.

{Ref. 15} E. Ando, "Radiation Thermocouples with (Bi, Sb)$_2$(Te,Se)$_3$", Japanese Journal of Applied Physics, vol. 13, pp. 863–869, May 1974.

{Ref. 16} R. Fettig, M. Balzer, U. Birkholz, J. Hofmann and H. Meyer, "Thermoelectric IR-Detectors", Proceedings of the Eighth International Conference on Thermoelectric Energy Conversion and the Second European Conference on Thermoelectrics, July 1989, pp. 220–223.

{Ref. 17} F. Völklein, A. Wiegand and V. Baier, "High-sensitivity radiation thermopiles made of Bi—Sb—Te films", Sensors and Actuators A, vol. 29, pp. 87–91, 1991.

{Ref. 18} Electronic Products Division, Hoechst Celanese Corporation, Somerville, N.J.

{Ref. 19} R. C. Jones, "Factors of Merit for Radiation Detectors", Journal of the Optical Society of America, vol. 39, pp. 344–356, May 1949.

{Ref. 20} R. C. Jones, "A New Classification System for Radiation Detectors", Journal of the Optical Society of America, vol. 39, pp. 327–343, May 1949.

{Ref. 21} A. Dehé and H. L. Hartnagel, "Free-Standing AlGaAs Thermopiles for Improved Infrared Sensor Design", IEEE Transactions on Electron Devices, vol. 43, pp. 1193–1199, 1996.

{Ref. 22} H. Scherrer and S. Scherrer, "An Overview of the Thermoelectric Properties of the Ternary (Bi,Sb,Te) and (Bi,Te,Se) Systems", Proceedings of the 12th International Conference on Thermoelectrics, pp. 90–96, 1993.

{Ref. 23} E. Kessler et al. "A 256 pixel linear thermopile array using materials with high thermoelectric efficiency", Proceedings of the 16th International Conference on thermoelectrics, 1997, pp. 734–737.

{Ref. 24} O. I. Kupchinskii et al., Opt. Mekh. Prom., No. 8, p. 27, 1961. This work is summarized in English in {Ref. 25}.

{Ref. 25} N. A. Pankratov, "Modern semiconductor thermoelectric radiation detectors", Sov. J. Opt. Technol., vol. 60, pp. 522–529, 1993.

{Ref. 26} V. V. Razinkov et al., "High-Responsive Thermoelectric Radiation Receivers", Journal of Thermoelectricity, vol. 1. no. 1, pp. 62–66, 1993.

{Ref. 27} M. Muller et al., "A Thermoelectric infrared Radiation Sensor With Monolithically Integrated Amplifier Stage and Temperature Sensor", Proceedings of the 8th International Conference on Solid-State Sensors and Actuators (Transducers '95), and Eurosensors IX, pp.640–643, 1995.

DEFINITIONS

By the term "thermocouple detector" as used herein is meant a thermocouple that is configured such that the input signal to be measured creates a temperature change at the hot junction, resulting in a voltage change across the thermocouple.

By the term "thermocouple array" as used herein is meant a group of usually identical thermocouple detectors together on the same substrate.

By the term "thermopile detector" as used herein is meant a thermopile that is configured such that the input signal to be measured creates a temperature change at the hot junctions, resulting in a voltage change across the thermopile.

By the term "thermopile array" as used herein is meant a group of usually identical thermopile detectors together on the same substrate.

Frequently the input signal to be measured is radiation, which is absorbed near the hot junction or hot junctions. Typical configurations of thermocouple and thermopile detectors are linear arrays and 2-dimensional arrays.

By the term "detector pitch" as used herein is meant the distance from the center of one detector to the center of the adjacent detector in an array.

By the term "detector width" as used herein is meant the width of the detector membrane measured in a direction parallel to a line connecting the center of one detector to the center of another detector in a linear array.

By the term "micromachining" as used herein is meant the formation of small mechanical structures using photolithographic processes and etching. Usually, but not always, silicon is used as a substrate and the photolithographic processes used are the same as those used in the microelectronics fabrication. Micromachining offers the ability to make well defined structures on the scale of one to hundreds of micrometers. Large arrays of identical structures can be formed.

BACKGROUND ART

The development of uncooled staring two-dimensional arrays of both resistive bolometers {Ref. 1} and ferroelectric detectors {Ref. 2} has shown the potential for uncooled thermal infrared detectors. A third class of thermal detectors, thermopiles, has not been developed in array formats to the extent of bolometers and ferroelectrics. However, these detectors are ideal for some applications due to their simple system requirements. Thermopiles typically operate over a broad temperature range and are insensitive to drifts in substrate temperature. They are passive devices, generating a voltage output without electrical bias or chopping. For some applications thermopile detectors can be supported by simpler, lower power, more reliable systems than either bolometers, pyroelectric or ferroelectric detectors. If thermopiles are read out with high-input-impedance amplifiers they exhibit negligible excess (1/f) noise since there is no current flow. They typically have high linearity over many orders of magnitude in incident infrared power.

A few groups have demonstrated micromachined arrays of thermopile infrared detectors. Most efforts have focused on silicon-based thermocouple elements, including polysilicon/gold linear arrays {Ref. 3,4}, silicon/aluminum linear arrays {Ref. 5}, and n-polysilicon/p-polysilicon two-dimensional arrays {Ref. 6,7}. An advantage of using silicon-based materials is that many of the processing steps can be done on a standard CMOS fabrication line, substantially reducing the cost for mass production. Properly doped silicon or polysilicon can have a Seebeck coefficient as large as 1 mV/K {Ref. 6,8}, resulting in a relatively large detector responsivity and facilitating low noise readout design. The Seebeck coefficient of polysilicon from typical CMOS fabrication facilities, however, is only about 100 $\mu$V/K {Ref. 9,10}. A drawback of silicon or polysilicon as thermoelectric elements is that their thermoelectric figure of merit, Z, defined as the Seebeck coefficient squared divided by both the thermal conductivity and the electrical resistivity, is relatively low (Z=1–4×10$^{-5}$ K$^{-1}$) {Ref. 11}. The detectivity of a thermoelectric detector increases roughly as the square root of Z {Ref. 12}. Current silicon and polysilicon thermopile detector arrays have specific detectivity (D*) values less than 10$^8$ cmHz$^{1/2}$/W for 10 ms response times. D* is defined as the square root of detector area divided by the noise equivalent power. The noise equivalent power, expressed in Watts per square root of Hertz, is equal to the power incident on the detector that produces a signal equal to the noise spectral density at the detector output.

Honeywell has developed 128-element micromachined linear arrays of thermopile detectors using metal film featuring constantan and chromel as the thermoelectric materials {Ref. 13,14}. Metals such as constantan and chromel have a higher thermoelectric figure of merit than silicon or polysilicon (Z≈10$^{-4}$ K$^{-1}$), unfortunately however, metal thermoelectric elements such as constantan and chromel are not standard materials in CMOS fabrication lines. The Honeywell arrays are understood to have zero frequency D* values of 1.4×10$^8$ cmHz$^{1/2}$/W and 12 ms response times.

The materials with the highest thermoelectric figure of merit at room temperature are compounds in the $(Bi_{1-x}Sb_x)_2(Te_{1-y}Se_y)_3$ family. Unfortunately, such materials are difficult to fabricate in thin film form and are not amenable with CMOS processes. These thermoelectric materials, however, do have potential for the most sensitive detectors. Thermocouple detectors made with single crystal bulk $(Bi_{1-x}Sb_x)_2(Te_{1-y}Se_y)_3$. materials have demonstrated D* values of 3–4× 10$^9$ cmHz$^{1/2}$/W for thermal response times of about 25 ms {Ref. 15,16}. However, such detectors are hand assembled, difficult to make into arrays, fragile, and have low responsivity. Single thin film thermopile detectors with D*=7.7× 10$^8$ cmHz$^{1/2}$/W and response times of 44 ms have been reported {Ref. 17}. However, arrays of thermopile detectors with high ratio of detector width to detector pitch and with thin film thermoelectric materials selected from the group consisting of antimony, bismuth, selenium, tellurium and mixtures thereof have not been reported by others. In addition, there have been no reports of single detectors made with this group of thermoelectric materials on micromachined membranes in which slits and gaps are cut through the membrane to further thermally isolate the detectors from the substrate, wherein the gaps intersect the slits at an angle. The highest ratio of detector width to detector pitch for these thermoelectric materials in a linear array is 0.51 {Ref. 23}.

SUMMARY OF THE INVENTION

In one embodiment of this invention, each planar face of a silicon wafer is coated with a 600–1300 521 silicon nitride layer. Two metallization steps produce interconnect lines and pads. A photoresist lift-off stencil is patterned, then 1 $\mu$m of the first line of thermoelectric materials is deposited by sputtering from a compound target. A similar process is used to deposit the second thermoelectric material. The entire structure is coated with another silicon nitride layer for passivation and mechanical support. Silicon under the devices is remove by etching in hot potassium hydroxide from the wafer backside to form an opening or window. Slits are etched through the resulting membrane to thermally isolate individual detectors. The resulting detectors comprise membranes connected at their two ends to the silicon substrate. In one embodiment, each membrane consists of two silicon nitride layers, with a total silicon nitride thickness of about 0.6 $\mu$m plus the thickness of the thermoelectric and metal lines therebetween where present.

The performance of the micromachined thermopile detectors and their arrays of this invention which have high ratio of detector width to detector pitch and thin film thermoelectric materials selected from the group consisting of antimony, bismuth, selenium, tellurium and mixtures thereof, have the higher performance as determined by D* than those reported by others in the art. For example, in one embodiment of this invention, micromachined 63-element linear arrays exhibit D* values of $1.4\times10^9$ cmHz$^{1/2}$/W and 99 ms response times while under vacuum at room temperature. When performance is compared in a manner which takes into account differences in response time, this result represents an improvement by a factor of 3 over other reported thermopile arrays. The arrays are composed of Bi—Sb—Se—Te thermoelectric lines on thermally isolated silicon nitride membranes connected to a silicon substrate.

In one embodiment of this invention, the detectors are 1.5 mm long with a 75 $\mu$m detector pitch, matching the geometry of a compact spectrometer under development at Ion Optics, Inc., Waltham, Mass. In general, the thermopile linear arrays of this invention are well suited for compact, low power spectrometers because of their minimal system requirements and high broadband D* values.

Accordingly, there is provided by the principles of this invention a micromachined thermoelectric array comprising a plurality of spaced apart thermoelectric detectors. Each detector has a thin dielectric membrane which includes at least one thermocouple having thermoelectric lines that form hot junction means for sensing a source radiation and cold junction means for sensing a reference temperature associated signal. The thermoelectric lines are formed from compositions selected from the group consisting of antimony, bismuth, selenium, tellurium and mixtures thereof.

The array includes means for enhancing thermal isolation of the hot junction means of each detector from the hot junction means of the other detectors, and a micromachined substrate for supporting the thin dielectric membrane such that the substrate is opposite the cold junction means but not opposite the hot junction means so that there is an opening or window in the substrate opposite the hot junction means.

In one embodiment, the detectors are arranged in a column thereby forming a linear array. In another embodiment, the number of the detectors is at least about 20 and in still another embodiment, the number is at least about 60.

In one embodiment, the thin dielectric membrane comprises two thin dielectric layers which sandwich therebetween the thermoelectric lines, the hot junction means and the cold junction means. In a further embodiment, the thermoelectric lines lie directly on one of the thin dielectric layers, and in a still further embodiment, a thin adhesion layer is between the thermoelectric lines and one of the thin dielectric layers.

In one embodiment each detector has one thermocouple, in another embodiment each detector has a plurality of thermocouples, and means for connecting the thermocouples in series thereby forming a thermopile. In one embodiment, each detector has at least five thermocouples, and in another embodiment, each detector has at least eleven thermocouples.

In one embodiment, the number of the thermocouples in the array is at least about 20, in another embodiment the number is at least about 150, and in yet another embodiment the number is at least about 600.

In one embodiment, the thermoelectric materials are formed from compositions selected from the group consisting of antimony, bismuth, tellurium and mixtures thereof. In another embodiment, the thermoelectric materials are Bi—Te and Bi—Sb—Te, and in still another embodiment, they have approximately the compositions $Bi_{2.0}Te_{3.0}$ and $Bi_{0.55}Sb_{1.45}Te_{3.6}$.

In one embodiment, the means for enhancing thermal isolation of the hot junction means of each detector from the hot junction means of the other detectors includes slits having small widths on opposite sides of the detectors that extends through the thin dielectric membrane in a direction approximately perpendicular thereto. The widths of the slits are small relative to the widths of the detectors and the slits extend into the opening in the substrate. The width and length of several detector embodiments are indicated for example in FIGS. 4 and 7–9.

In one embodiment, the small widths of the slits are no greater than about 30 $\mu$m, in another embodiment the widths are no greater than about 20 $\mu$m, in still another embodiment the widths of the slits are no greater than about 10 $\mu$m, and in a preferred embodiment the widths are no greater than about 4 $\mu$m.

In one embodiment, the opening in the substrate is also opposite a greater portion of the thermoelectric lines.

In one embodiment, the array has a high ratio of detector width to detector pitch opposite the opening in the substrate. In another embodiment, the ratio of detector width to detector pitch is at least about 0.65, and in still another embodiment the ratio of detector width to detector pitch is from about 0.80 to about 0.99.

In further embodiments of the aforementioned arrays, means for enhancing thermal isolation of the hot junction means of each detector from the substrate is provided. In one embodiment, the means comprises, for each detector, two gaps having narrow widths near but on opposite sides of a perimeter of the opening in the substrate with the hot junction means therebetween. The gaps are approximately perpendicular to and extend through the thin dielectric membrane into the opening in the substrate. The widths of the gaps are small relative to the widths of the detector. In another embodiment, at least a portion of one of the gaps is oriented at an angle to and intersects a slit on one of the sides of the detector and at least a portion of another of the gaps is oriented at an angle to and intersects another slit on another side of the detector.

In one embodiment, the small widths of the gaps are no greater than about 30 $\mu$m, in another embodiment the widths are no greater than about 20 $\mu$m, in still another embodiment the widths of the gaps are no greater than about 10 $\mu$m, and in a preferred embodiment the widths are no greater than about 4 $\mu$m.

In one embodiment, the array further comprises a layer of radiation absorption material supported by the thin dielectric membrane opposite the opening in the substrate. In another embodiment, the absorption material is an infrared absorbing layer of platinum. In still another embodiment, the absorption material is on the surface of the thin dielectric membrane that faces the opening.

In one embodiment, the array further comprises means for electrically connecting the array to processing circuitry. In another embodiment, the array further comprises amplification means electrically connected to said each detector for low noise amplification of a signal from said each detector, and in still another embodiment processing means for multiplexing the signals from the amplification means of the detectors is provided.

There is also provided by the principles of this invention a micromachined thermoelectric sensor which comprises a detector having a thin dielectric membrane which defines a plane. The thin dielectric membrane includes at least one thermocouple having thermoelectric lines that form hot junction means for sensing a source radiation and cold junction means for sensing a reference temperature associated signal. The thermoelectric lines are formed from compositions selected from the group consisting of antimony, bismuth, selenium, tellurium and mixtures thereof.

The sensor includes a micromachined substrate for supporting the thin dielectric membrane such that the substrate is opposite the cold junction means but not opposite the hot junction means thereby also providing an opening or window in the substrate opposite the hot junction means.

The sensor also has two slits having small widths on opposite sides of the detector approximately perpendicular to a plane formed by the thin dielectric membrane and extending through the membrane for enhancing thermal isolation of the hot junction means of the detector from the substrate. The widths of the slits are small relative to widths of the detector. In still another embodiment, two gaps having narrow widths on opposite sides of the hot junction means are provided for enhancing thermal isolation of the hot junction means as described for the arrays of this invention.

There is also provided by the principles of this invention a process for forming a micromachined thermoelectric array comprising providing a substrate having a frontside surface and a backside surface, and forming an array having a plurality of detectors on the frontside surface of the substrate. Each detector has a thin dielectric membrane which includes a plurality of patterned thin thermoelectric lines, hot junction means for sensing a source radiation and cold junction means for sensing a reference temperature associated signal. Each detector is spaced apart from neighboring detectors by a small distance relative to the widths of the detectors. The thermoelectric lines are formed from compositions selected from the group consisting of antimony, bismuth, selenium, tellurium and mixtures thereof.

The process includes micromachining an opening in a portion of a backside surface of the substrate opposite the hot junction means but not opposite the cold junction means, and forming slits having small widths on opposite sides of the detectors in the array and through the thin dielectric membrane and into the opening of the substrate for enhancing thermal isolation of the hot junction means of each detector in the array from the hot junction means of the other detectors in the array. The widths of the slits are small relative to widths of the detectors, and the distance between detectors is small enough that the array has a high ratio of detector width to detector pitch opposite the opening in the substrate of the array.

In one embodiment, the forming of the thin dielectric membrane includes forming a first thin dielectric layer on the frontside surface of the substrate, followed by forming the plurality of thermoelectric lines and the hot and cold junction means on the first thin dielectric layer, which is followed by forming a second thin dielectric layer on the plurality of thermoelectric lines and the hot and cold junction means and the first thin dielectric layer so that the plurality of thermoelectric lines and the hot and cold junction means are sandwiched between the first and second thin dielectric layers.

In one embodiment, the micromachining of the opening in the portion of the backside surface of the substrate includes isolating the array of detectors in an etching jig that prevents attack by an operable etchant to the array except for a predetermined unprotected portion of the backside surface of the substrate. Then, while the array of detectors is in the etching jig, treating the unprotected portion of the backside surface of the substrate with the operable etchant under conditions effective for removing the unprotected portion of the substrate, and stopping the treatment when the etchant reaches the thin dielectric membrane thereby completing the micromachining of the opening in the predetermined unprotected backside portion of the substrate. In another embodiment, the isolating of the array of detectors in the etching jig further includes sealing and temporarily bonding a perimeter of the frontside surface of the substrate with a temporary bonding agent to an etchant-impermeable first plate, and sealing a perimeter of the backside surface of the substrate to an etchant-impermeable second plate having an opening facing the predetermined unprotected portion of the backside of the substrate. In a further embodiment, the isolating of the array of detectors in the etching jig also includes sealing the second plate to an etchant-impermeable cap that spans the etchant-impermeable first plate thereby providing means for preventing the etchant from contacting the temporary bonding agent.

In one embodiment, the distance between the detectors in the array is no greater than about 30 $\mu$m. In another embodiment this distance is no greater than about 20 $\mu$m, in yet another embodiment is no greater than about 10 $\mu$m, and in a preferred embodiment is no greater than about 4 $\mu$m.

In one embodiment, the process further comprises, for each detector in the array, forming two gaps having narrow widths near but on opposite sides of a perimeter of the opening in the substrate, with the hot junction means of the detector therebetween for enhancing thermal isolation of the hot junction means of the detectors from the substrate. The narrow widths of the gaps are small relative to widths of the detector. The gaps are formed approximately perpendicular to the thin dielectric membrane and extend through the thin dielectric membrane and into the opening in the substrate. At least a portion of one of the gaps is oriented at an angle to, and intersects the slit on one side of the detector, and at least a portion of another of the gaps is oriented at an angle to and intersects another slit on another side of the detector.

In one embodiment, the process further comprises forming a radiation absorbing layer supported by the thin dielectric membrane at the opening.

In another embodiment, the process further comprises forming a plurality of said micromachined thermoelectric arrays on the substrate; and wherein the micromachining of the opening in the portion of the backside surface of the substrate further includes forming a groove in the substrate around each array for defining a boundary for each array and a scrap portion of the substrate, and thereafter, separating the arrays from each other and from the scrap portion of the substrate at the grooves. In a modified process before separating the arrays from each other and from the scrap portion of the substrate, forming a radiation absorbing layer supported by the thin dielectric membrane at the opening of each array.

There is also provided by the principles of this invention a process for forming a micromachined thermoelectric sensor having a detector which comprises providing a substrate having a frontside surface and a backside surface, the frontside surface defining a plane, and forming a detector on the frontside surface of a substrate. The detector having a thin dielectric membrane which includes a plurality of patterned thin thermoelectric lines, hot junction means for sensing a source radiation and cold junction means for sensing a reference temperature associated signal, wherein the thermoelectric lines being formed from compositions selected from the group consisting of antimony, bismuth, selenium, tellurium and mixtures thereof.

The process for forming the sensor also includes micromachining an opening in a portion of the backside surface of the substrate opposite the hot junction means but not opposite the cold junction means, and forming two slits having small widths on opposite sides of the detector, approximately perpendicular to the plane of the thin dielectric membrane and extending through the thin dielectric membrane for enhancing thermal isolation of the hot junction means of the detector from the substrate. The two slits are formed close to opposite portions of a perimeter of the detector.

DESCRIPTION OF THE PREFERRED EMBODIMENTS

The Thermoelectric Materials

Figure 1:
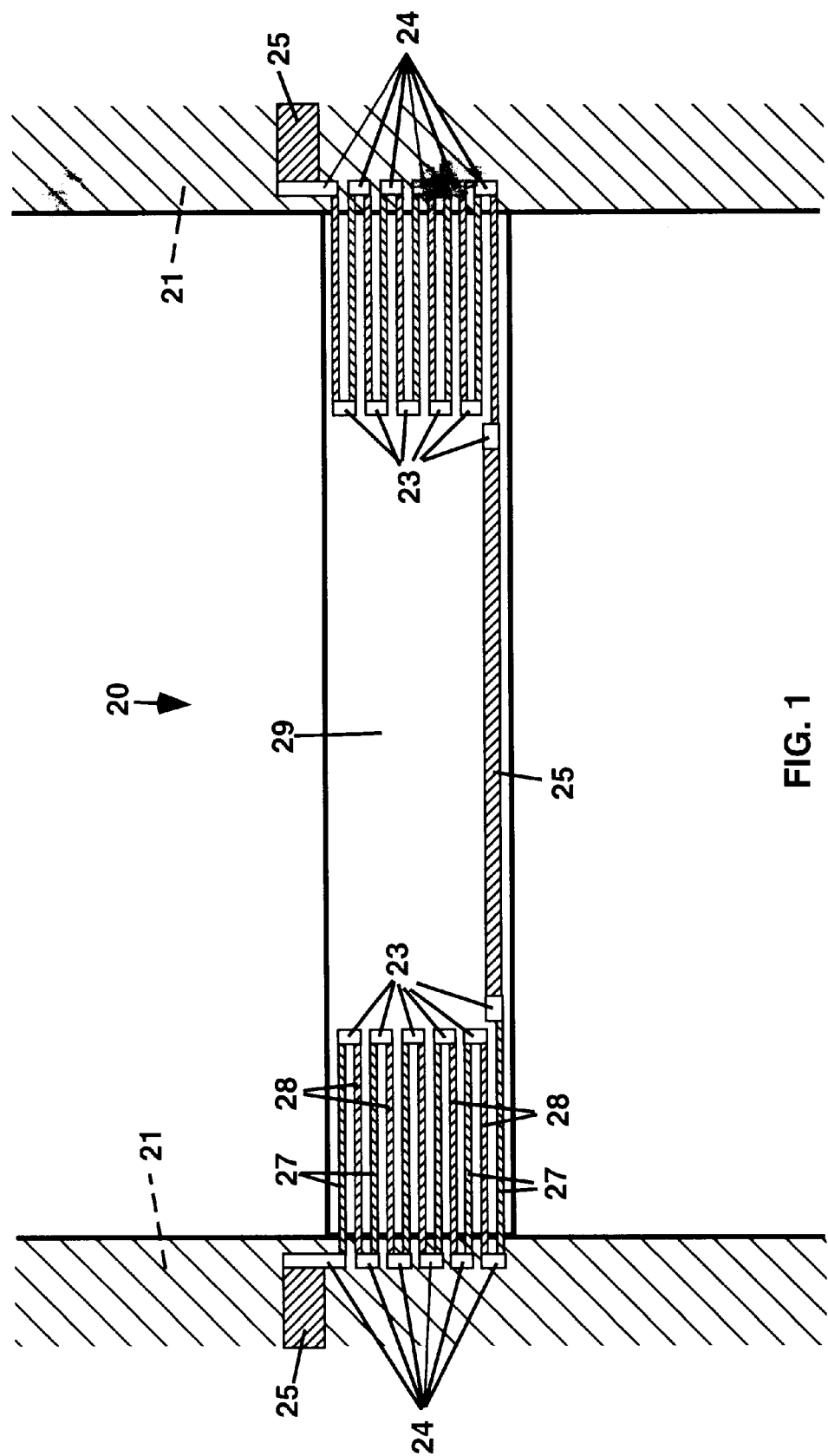
FIG. 1 is a schematic top view of a single micromachined detector of this invention.

The Bi—Te and Bi—Sb—Te films were sputter deposited from a Kurt J. Lesker Company Torus 2 sputter gun. Two thermoelectric material targets were employed. A two inch diameter sputter first target of composition $Bi_{0.4}Sb_{1.6}Te_{3.0}$ was procured from Target Materials, Inc. A two inch second target of composition $Bi_{2.0}Te_{3.5}$ was manufactured by us at The Jet Propulsion Laboratory ("JPL"), Pasadena, Calif. The second target was made by mixing bismuth and tellurium shot, then annealing at about 650° C. in a sealed, evacuated quartz ampoule for 10 h. After quenching the ampoule in water, the ingot was ground into a powder. The powder was pressed for 2 h at 350° C. with a pressure of about $8 \times 10^7$ Pa.

Films were deposited in a vacuum chamber with an initial pressure of about $10^{-4}$ Pa. Prior to deposition of the thermoelectric materials an adhesion layer of titanium was thermally evaporated from a 75% tantalum, 25% titanium alloy wire, from Getter Corporation of America, and deposited on a thin silicon nitride layer. It was found that the titanium adhesion layer dramatically improved film adhesion without adversely affecting thermoelectric properties. Next a 1 $\mu$m thick Bi—Te or Bi—Sb—Te film was deposited with 0.7 Pa of argon gas, at ambient temperature, and with a target-substrate distance of 15 cm.

As an indication of stress, Bi—Te and Bi—Sb—Te films were deposited on silicon nitride membranes designed to deform under stress. At pressures below 0.7 Pa the membranes bowed in a direction which indicated the existence of compressive stress in the deposited thermoelectric lines. However, no bowing was seen for depositions at 0.7 Pa. Test films of Bi—Te and Bi—Sb—Te were deposited onto thin (0.15 mm) glass substrates. Inductively coupled plasma spectroscopy indicated film compositions of $Bi_{2.0}Te_{3.0}$ and $Bi_{0.55}Sb_{1.45}Te_{3.6}$.

To measure Seebeck coefficients of the test films, pieces roughly 2 mm by 15 mm were cut from the glass substrates. The ends of these pieces were bonded, film side down, to two copper blocks with silver paint, such that the film and substrate bridged the 7 mm gap between the two blocks. A heater and a silicon diode thermometer on each copper block monitored and controlled the temperatures. The entire assembly was placed in vapor over a liquid nitrogen bath. While the temperature of one block was held constant at 300 K, the temperature of the other block was ramped from about 298 K to 302 K. A voltmeter, connected to the blocks with copper wires, measured the voltage across the film. The slope of voltage versus temperature, corrected for the Seebeck coefficient of copper wire, yielded the sample Seebeck coefficient. After annealing at 300° C. in flowing argon gas for 2 h, the Bi—Te test film exhibited a resistivity of $1.3 \times 10^{-5}$ $\Omega$m and a Seebeck coefficient of $-136$ $\mu$V/K at room temperature. The annealed Bi—Sb—Te test film had a resistivity of 2.2 $10^{-5}$ $\Omega$m and a Seebeck coefficient of $-153$ $\mu$V/K at room temperature. Four probe structures on fully processed array wafers indicated an increase in resistivity for both types of films to about 2.7 m$\Omega$cm during processing.

Detector and Array Fabrication

Figure 2:
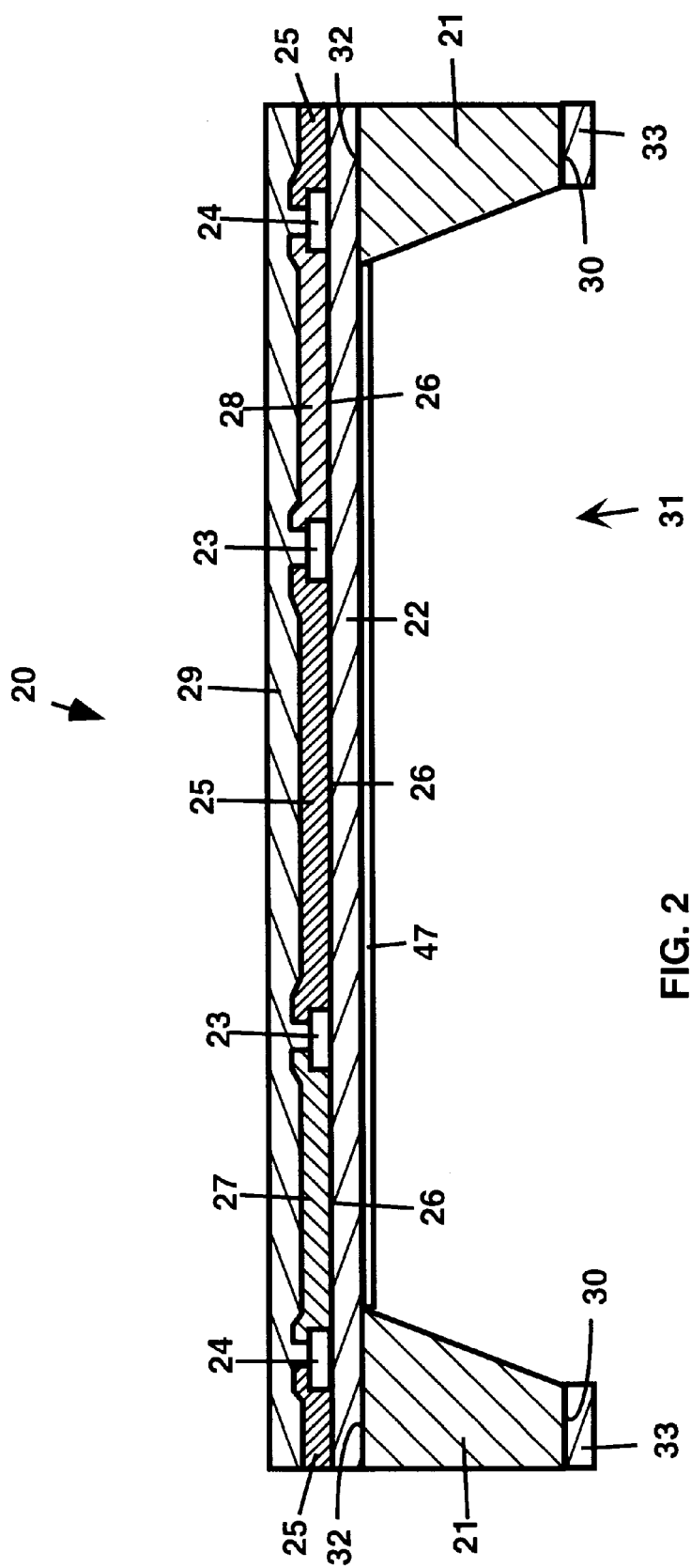
FIG. 2 is a schematic cross section of the single micromachined detector of FIG. 1.

FIGS. 1 and 2 are schematic diagrams of a single detector 20. A silicon wafer 21, 3 inches in diameter, 400 $\mu$m thick and (100) oriented was coated on both sides with 130 nm of low stress silicon nitride layers 22 and 33 by chemical-vapor-deposition ("CVD"). A lift-off stencil was defined with an AZ 5214 photoresist reversal process {Ref. 18}. Contact pads 23 and 24, to connect the two thermoelectric layers to each other and to a gold interconnect layer 25, were formed by lifting off 10 nm of gold over 40 nm of titanium. The gold interconnect layer 25, with a thin titanium adhesion layer 26, was then deposited and lifted off using a similar photoresist stencil. Thicker AZ 5218 photoresist stencils were used for the two 1 $\mu$m thick thermoelectric materials 27 and 28, which were deposited at ambient temperature and lifted off in acetone. Each thermoelectric line has under it a thin titanium adhesion layer 26. Each detector 20 had 11 thermocouple elements with 3 $\mu$m line widths. At this point it will be appreciated that hot and cold junctions have now been formed at contact pads 23 and 24, respectively. A 500 nm thick layer of silicon nitride 29 was then deposited over the wafer in an electron-cyclotron-resonance ("ECR") system with a substrate temperature of about 200° C.

Figure 3:
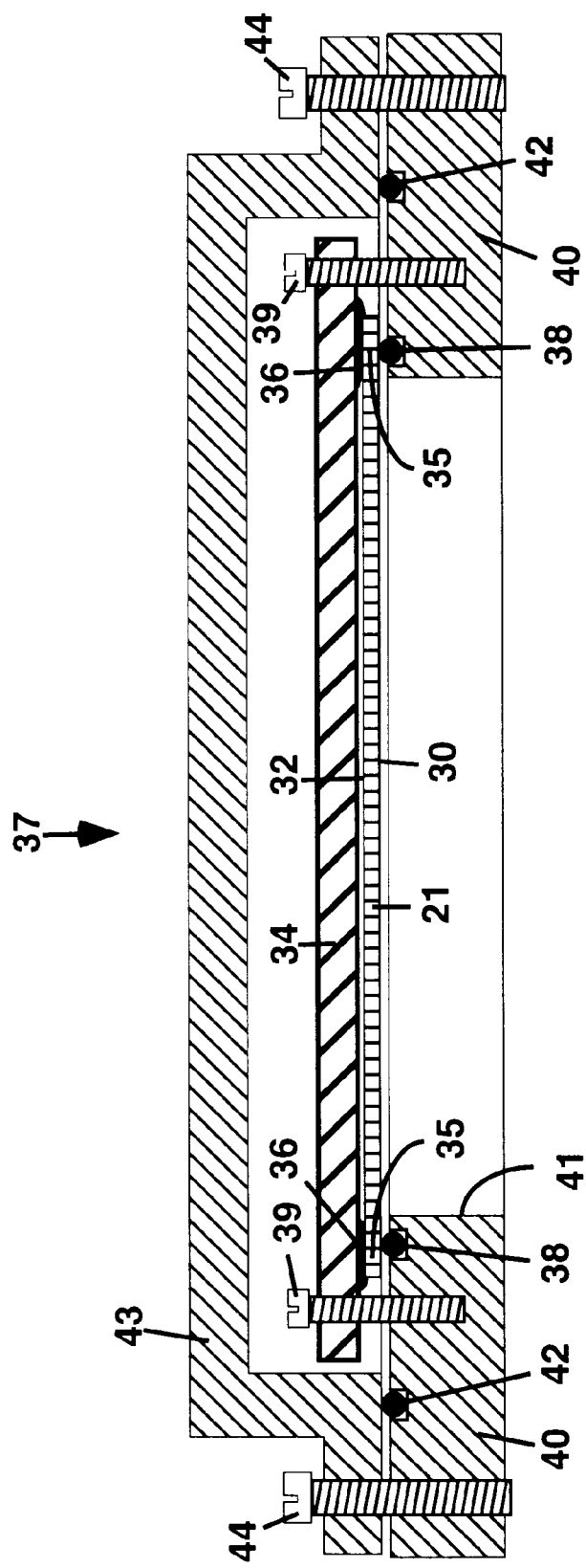
FIG. 3 is a cross section of an etching jig used to protect arrays during backside etching for producing an opening.

A portion of the silicon substrate was then removed from the backside 30 of the wafer 21 with a hot potassium hydroxide etch to produce opening or window 31. First etch areas were cut through the silicon nitride layer 33 to the wafer backside 30 with a $CF_4$—$O_2$ reactive ion etch. Then wafer 21 was placed frontside 32 down on a stainless steel first plate 34 and sealed around its perimeter 35 with wax 36 as illustrated in FIG. 3.

The wafer 21 with its backside 30 exposed and first plate 34 were then placed in an etching jig 37 with an O-ring seal 38 around the wafer edge and secured with fasteners 39. Jig 37 further comprises second plate 40 having an opening 41, O-ring seal 42, cap 43 and fasteners 44. Second plate 40 and cap 43 are made from an etchant resistant material, preferably made from a plastic such as an acetohomopolymer; for example DELRIN™ plastic. Fasteners 39 and 44 are also made from an etchant resistant material, preferably made from a plastic such as a polyamide; for example NYLON™ plastic. Thus, frontside 32 of the wafer is protected from the hot KOH etch by a double barrier of O-ring 38 and wax 36 and further protected by O-ring 42 and cap 43.

The wafer was etched for about 30 h in a 55° C. KOH etching solution composed of 440 g dissolved KOH pellets per liter of water. After the etchant had formed opening 31, the wafer was then removed from the stainless steel first plate 34 with toluene.

One additional photolithography step was performed in order to open slits 46 through the silicon nitride layers 22 and 29 to separate the individual detectors in the arrays. Although the membranes are fragile, photoresist can be spun on using a vacuumless chuck. The slits 46 through the silicon nitride were cut with a $CF_4$—$O_2$ reactive ion etch. Photoresist removal after this etch is difficult. Ultrasonic cleaning or agitation in a solvent will break the membranes. In one embodiment of the process of this invention, the adequate photoresist removal was achieved with a short oxygen plasma treatment followed by an acetone soak. Although a longer oxygen plasma exposure will remove the photoresist completely, it may also damage some thermoelectric materials.

Next an infrared absorbing layer of platinum 47 about 40 Å thick was deposited on the back side of the wafer and membranes. The platinum thickness was determined by achieving a resistance of 160 to 200 Ω per square on a glass control substrate placed next to the silicon in the deposition chamber. Finally, the wafer was annealed in flowing argon gas at 300° C. for 2 h to improve the thermoelectric properties of the thermoelectric materials. Arrays were separated by cleaving along etched grooves (not shown in the drawings) etched simultaneously with the etching of the opening or window 31.

FIGS. 4 and 7–9 are photographs produced by digital camera showing sections of detector arrays actually produced and tested by this invention. Since they are photographs it can be appreciated that some components of these arrays appear as various shades of gray ranging from light gray to black depending on the reflectivity of the illuminating light when taking the photographs. Nevertheless, it is believed that many of the details of the arrays of this invention are best shown by these photographs. Because of the various shades of gray some of the element numbers inside the photographs are shown in small white boxes with white lead lines. When the element numbers are outside of the border of the photograph the white lead lines are changed to black at the border.

For brevity in FIGS. 4 and 7–9 the thermoelectric lines are said to be made from thermoelectric materials "A" and "B".

However, the actual thermoelectric materials "A" and "B" employed in the arrays of FIGS. 4 and 7–9 are formed from compositions selected from the group consisting of antimony, bismuth, selenium, tellurium and mixtures thereof.

Figure 4:
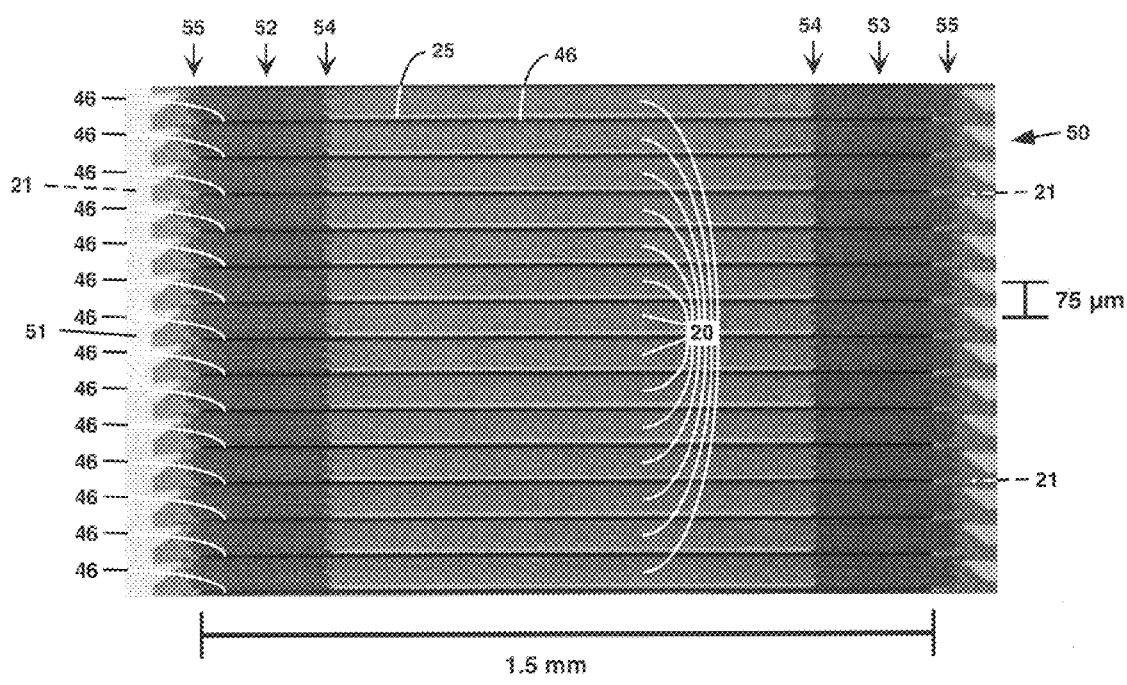
FIG. 4 is a digital photograph of a section of a first embodiment of a micromachined thermopile infrared detector array of this invention.

FIG. 4 is a photograph produced by digital camera showing a section of a completed thermopile detector array 50. FIG. 4 is a top view taken in the same direction as that of the schematic view of FIG. 1, however, 14 detectors are shown in FIG. 4 instead of just one detector as in FIG. 1. In the complete array, however, there are 63 detectors in this embodiment of this invention. Each detector 20 is separated by a 4 μm slit 46 from another detector 20 and is supported by a 71 μm wide, 1.5 mm long, and 0.6 μm thick silicon nitride membrane which comprises silicon nitride layers 22 and 29 and thermoelectric lines 52 and 53 Slits 46 extend through both upper and lower silicon nitride layers of the membrane to enhance thermal isolation of the hot junctions 54 of each detector 20 from the hot junction of other detectors in array 50. The ratio of detector width to detector pitch for the array of FIG. 4 is 71 μm/75 μm or 0.95.

Each detector is connected to the substrate 21 only at its ends which include contact pads 24. One side of each detector is connected electrically to a common electrode 51. Also included on the three inch wafer are chips with test structures to determine the electrical resistivities of the various metal layers and resistance of the contacts between metals.

Each of the detectors in FIG. 4 has thermoelectric lines 52 and 53 each of which comprise 5.5 hot junctions 54 formed at hot contact pads 23 and 5.5 cold junctions 55 formed at cold contact pads 24. Thermoelectric lines 52 are made up of thermoelectric materials "A" and "B" in the following serial order: ABABABABABA, while thermoelectric lines 53 are made up of thermoelectric materials "A" and "B" in the following serial order: BABABABABAB.

The steps in the process requiring the greatest care are the back side KOH etch and the separation of the wafer 21 from the stainless steel plate 34 following this etch. Referring to FIG. 3, it may be appreciated that if any membranes break during the etch, the KOH solution can leak to the frontside of the wafer and damage the thermoelectric lines through pin-holes in the passivating silicon nitride layer 29. Therefore, to prevent such damage to the arrays and sensors, this invention uses several techniques to prevent attack of the thermoelectric materials by the silicon etching solution. These techniques are:

(1) a silicon nitride passivation layer over the thermoelectric lines, (2) waxing the wafer face down to a stainless steel or other etchant resistant material plate during the etch, and (3) using a sealed jig to further confine the KOH solution to the substrate backside.

Detector Characterization Procedure

Four measurements on each detector determine (1) the infrared responsivity, (2) the response to electrical heating which we call the electrical responsivity, (3) the Seebeck coefficient of the thermocouples, and (4) the detector response time. From these four measurements, one can additionally calculate the absorptivity, the effective detector heat capacity, and the magnitude of the thermal conductance from the membrane. The thermal conductance is the sum of the conductance to the substrate through the silicon nitride membrane and thermoelectric materials plus the conductance due to radiative exchange with the environment.

The detectors of several arrays were tested in vacuum. The zero frequency infrared responsivity was measured with a 1000 K laboratory blackbody. The response time was measured by recording the signal decay after a shutter in front of the blackbody is closed. The decays were routinely measured from about 20 ms to 220 ms after closing the shutter, and were found to be exponential over this time period. Detectors measured for as long as 600 ms showed a continuation of this exponential decay.

Figure 5:
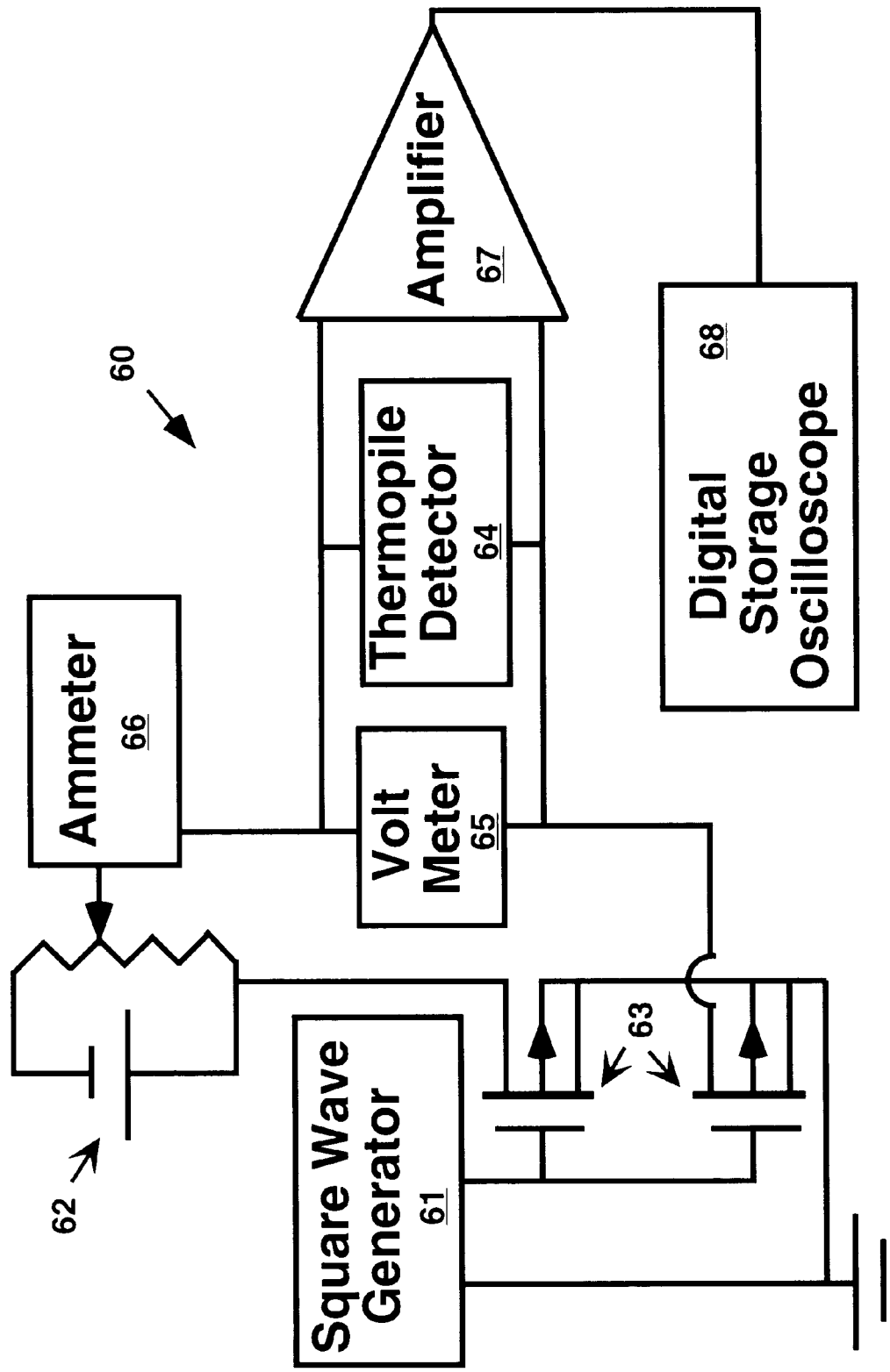
FIG. 5 is a diagram of a circuit used to measure electrical responsivity and Seebeck coefficient.

Detector electrical responsivity and Seebeck coefficient were measured using the circuit 60 shown in FIG. 5. A square wave generator 61 operating at about 0.3 Hz applies a −10 to 0 V signal to the base of a MOSFET switch pair 63. The switches connect and disconnect a voltage, produced by battery 62, across the thermopile detector 64 being tested. The current through the detector and the voltage across the detector are measured with battery-powered ammeter 66 and voltmeter 65, respectively. An EG&G Princeton Applied Research 113 preamplifier 67 amplifies the signal, which is stored and averaged with a digital oscilloscope 68.

The battery current through the detector produces two thermal effects, namely Joule heating occurring along the lengths of the thermoelectric lines, and Peltier cooling or heating occurring at the junctions between the two materials. The direction of current is such that Peltier cooling rather than heating occurs on the membrane. The assumption is made that the resulting temperature change in the central membrane area, as measured by the thermocouples, is the result of one half of the Joule heat generated plus all of the Peltier cooling at the hot junctions. It is assumed that the substrate is a good thermal ground and therefore any temperature change due to Peltier heat produced at the cold junctions is negligible. With these justifiable assumptions, the heating power at the isolated junctions is $$H = IV/2 - INST. \qquad \text{Eq. (1)}$$

Here I is the current through the detector, V is the voltage across the detector, N is the number of thermocouples in each detector, S is the Seebeck coefficient of one thermocouple, and T is the substrate temperature. For small values of applied current the Peltier term dominates and the current acts to decrease the membrane temperature. As the current increases, the Joule heating term becomes dominant. The oscilloscope records a trace each time the current is removed from the detector. Accordingly, immediately after the current is removed, the detector begins to approach the substrate temperature according to its thermal response time. In order to measure the Seebeck coefficient of the thermocouples, the current is adjusted until the Joule heating and Peltier cooling terms are equal, as evidenced by a flat trace on the oscilloscope after the current is removed; transient signals were disregarded. In this case Eq. (1) is equal to zero and S=V/2NT. The electrical responsivity is measured by increasing the current through the detector to produce a temperature difference of about 20 K between the membrane and substrate. The electrical responsivity is the ratio of (1) the voltage signal measured immediately after the current is turned off, to the (2) electrical heat applied; see Eq. (1). To reduce errors in the calculation of electrical heat applied, the current is increased until the Joule heating power is at least three times larger than the Peltier cooling power. The direction of current can be reversed such that the Peltier effect produces heating rather than cooling. In this case the measured value of electrical responsivity changes by only about 10%, suggesting the validity of the calculation for applied heat.

Using the measured values of infrared responsivity, electrical responsivity, and response time, values for detector absorptivity, thermal conductance, and heat capacity were calculated. The infrared and electrical responsivity at zero frequency are given by $$R_{IR} = \epsilon \beta NS/G \qquad \text{Eq. (2)}$$

$$\text{and } R_{EL} = NS/G. \qquad \text{Eq. (3)}$$

Here $\epsilon$ is the absorptivity of the detector, $\beta$ is the detector fill factor, and G is the thermal conductance. The absorptivity and the thermal conductance can then be calculated with the relationships $\epsilon = R_{IR}/\beta R_{EL}$ and $G = NS/R_{EL}$. The heat capacity is given by the response time multiplied by the thermal conductance. Thus many of the relevant electrical, optical, and thermal properties of the detectors can be measured or calculated without specialized test structures.

It is typical to assume that Johnson noise is the only significant noise source in thermoelectric detectors. In order the verify this assumption, noise was measured carefully at room temperature in three detectors selected arbitrarily from the same array. A cap was placed over the array chip package to minimize temperature drifts within the array field of view. The detector output was amplified with a chopper-stabilized TLC2654 operational amplifier from Texas Instruments, connected as a non-inverting amplifier with a gain of one thousand. The TLC2654 amplifier's input-referred voltage noise of about 45 nV/Hz$^{1/2}$ is higher than the typical detector noise of 26 nV/Hz$^{1/2}$. However, the excellent low frequency noise characteristics of this amplifier allowed the detector noise to be measured at 20 mHz. The amplifier contribution to total noise was characterized by first shorting the amplifier input to ground to obtain the amplifier voltage noise spectrum. A similar spectrum was recorded with a 620 k$\Omega$ resistor between the amplifier input and ground. This second spectrum is the root-mean-square sum of the amplifier voltage noise, the amplifier current noise multiplied by 620 k$\Omega$, and the Johnson noise of the 620 k$\Omega$ resistor. The amplifier current noise spectrum was then calculated from these two measurements. Thereafter, a noise spectrum was recorded with a thermopile detector across the amplifier input. From this noise spectrum, a root-mean-square subtraction of the amplifier voltage noise and the amplifier current noise times the detector resistance yields the noise due to the detector.

Table 1 shows detector and array dimensions and measured performance parameters in vacuum at room temperature of the array of FIG. 4. These values represent average values of all detectors in two 63-element arrays. The responsivity standard deviation is the average of the standard deviations for the two arrays. The dc infrared responsivity of 1100 V/W for radiation from a 1000 K blackbody source, combined with an average detector resistance of 40 k$\Omega$, gives a D*(f=0, 1000 K) value of $1.4 \times 10^9$ cmHz$^{1/2}$/W.

Figure 6:
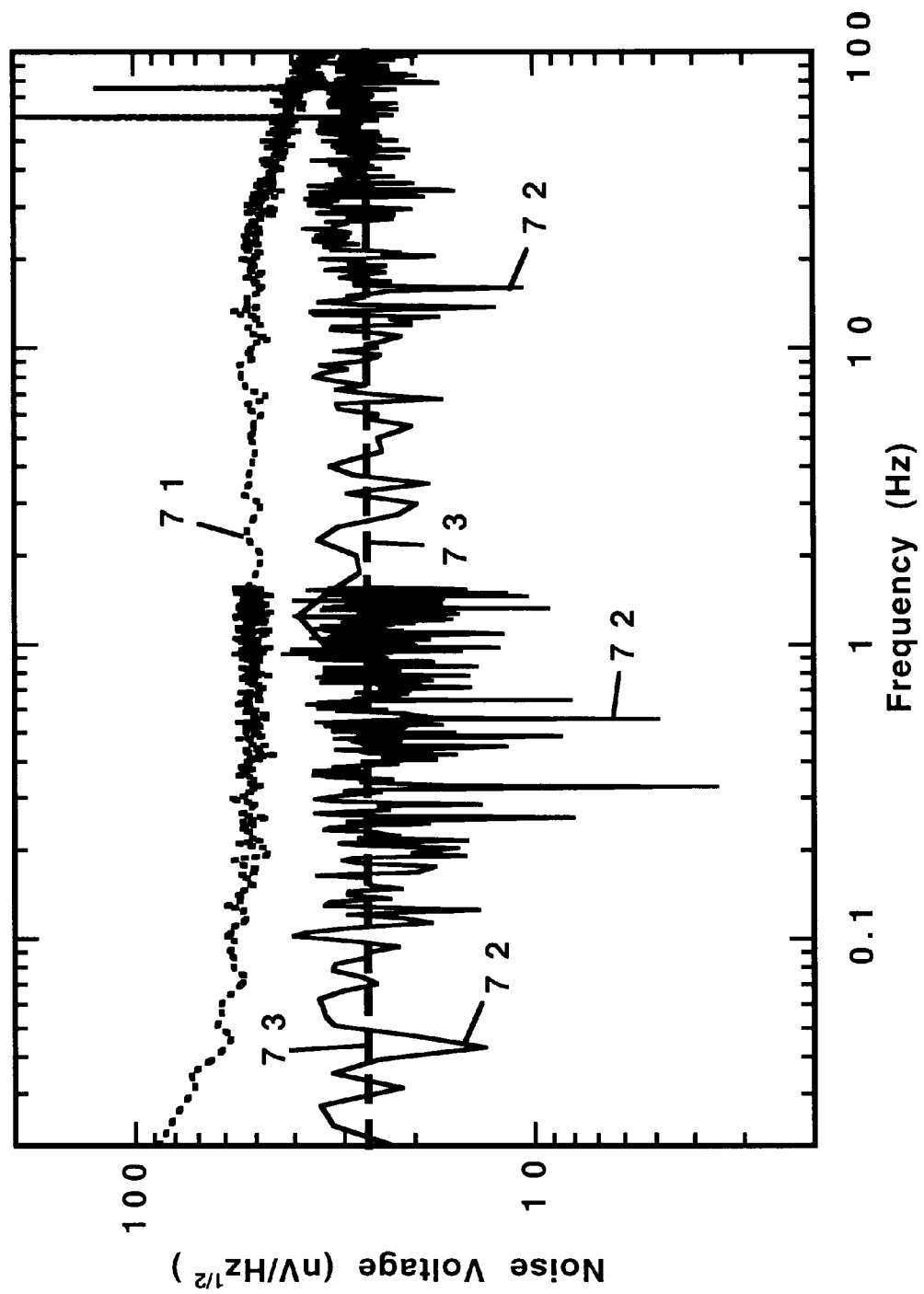
FIG. 6 is a graph of voltage-noise spectral density as a function of frequency for a micromachined 42 k$\Omega$ thermopile detector.

FIG. 6 is a graph of the total input-referred voltage-noise spectral density measured at the amplifier output with a 42 k$\Omega$ thermopile detector across the amplifier input as indicated by short-dashed line 71. This total noise is about 50–55 nV/Hz$^{1/2}$ between 0.1 and 10 Hz. Also shown is the calculated detector noise as indicated by solid line 72. The detector noise was calculated using the amplifier characteristics, and was found to agree well with the calculated value of detector Johnson noise down to 20 mHz as indicated by long-dashed line 73. For the three detectors tested, the average noise from 20 mHz to 10 Hz ranged from 26 to 28 nV/Hz$^{1/2}$, compared to the calculated Johnson noise of 26 nV/Hz$^{1/2}$ for the 42 k$\Omega$ detector resistance. Temperature fluctuation noise for these detectors is expected to be about 6 nV/Hz$^{1/2}$, which equals $2k_B^{1/2}NST/G^{1/2}$ with $k_B$ being the Boltzmann constant, and which contributes only a few percent to the total noise.

In order to compare these results with other thermopile detectors having different areas and response times, the figure of merit $M_2$ proposed by Jones {Ref. 19,20} is used. Jones showed that for both bolometers and thermopiles, changing the geometry of a detector results in changes in D* and response time, τ, that are related by a constant value of D*/τ$^{1/2}$. The figure of merit $M_2$ is defined as $M_2$=(6×10$^{-11}$ Ws/cm)D*/τ$^{1/2}$. In this invention, an approximately constant value of $M_2$ was observed for a variety of detector geometries on a single wafer, spanning about a factor of 12 in area and a factor of 6 in response time. For the embodiment shown in FIG. 4 the Bi—Te/Bi—Sb—Te thermopile arrays have an $M_2$ value of 0.27, compared to 0.08 for the Honeywell constantan/chromel arrays.

Figure 7:
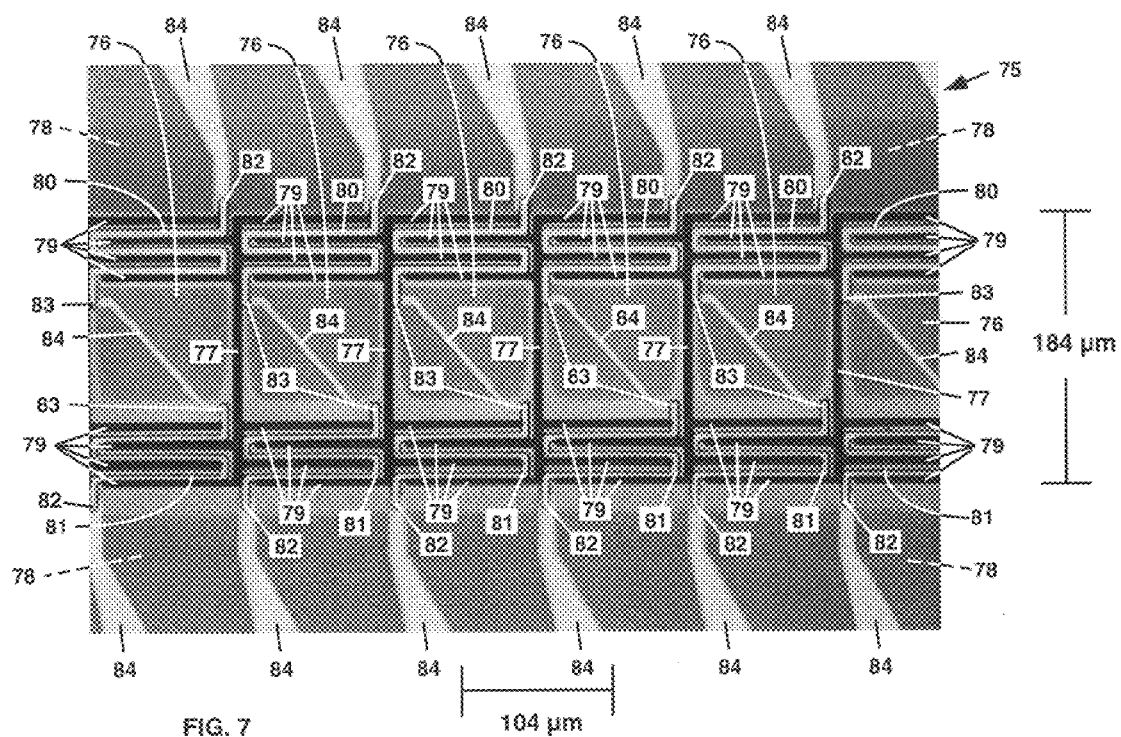
FIGS. 7, 8 and 9 are digital photographs of a section of three other embodiments of micromachined thermopile infrared detector arrays of this invention.
Figure 8:
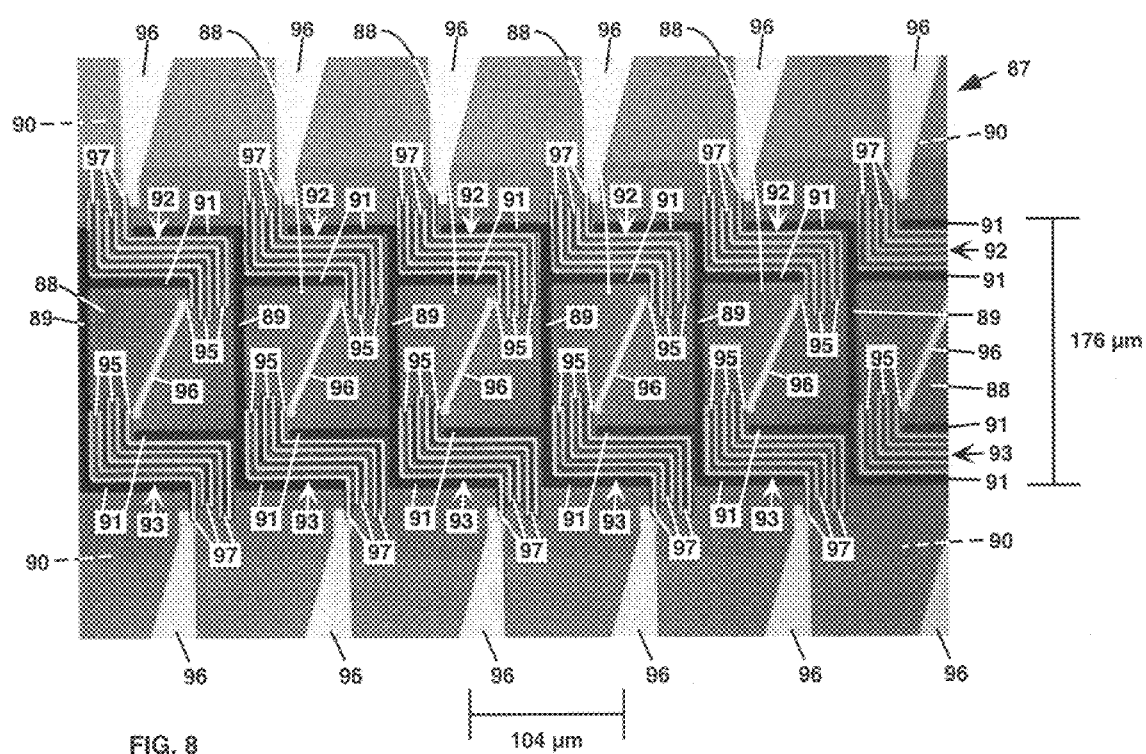
Figure 9:
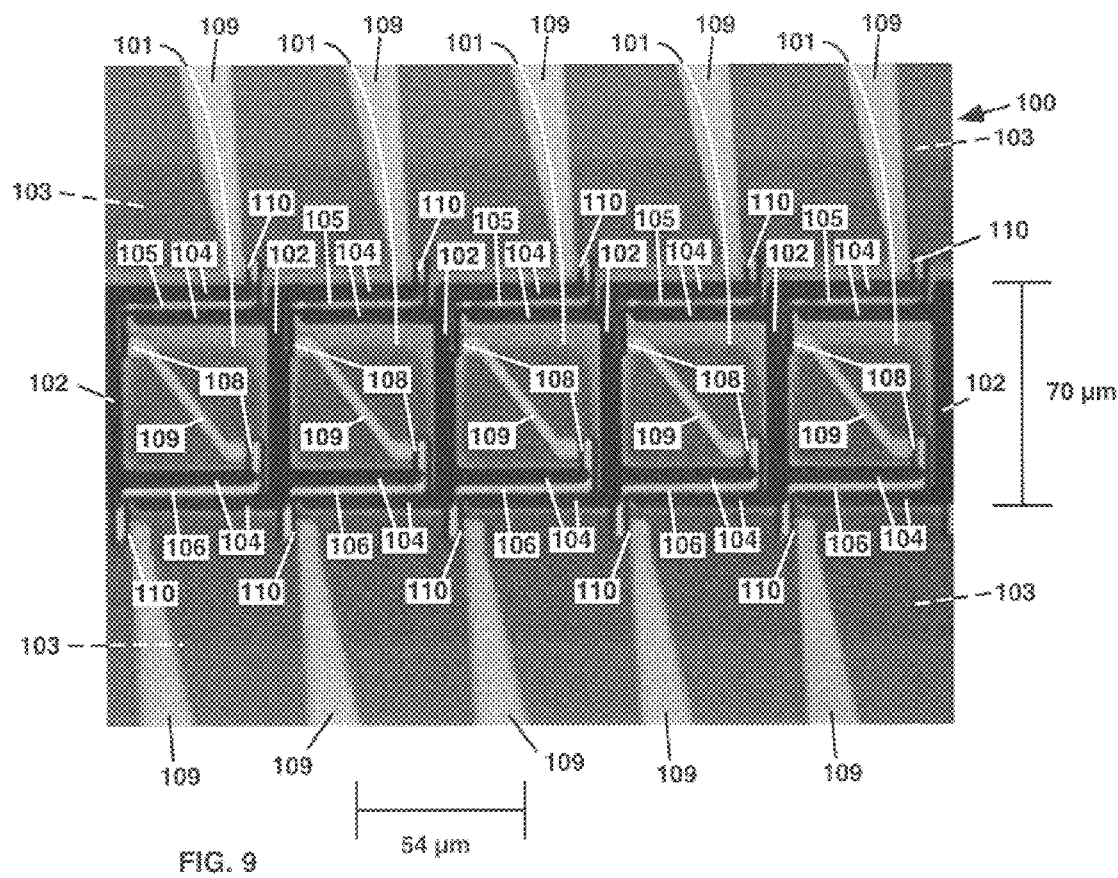

FIGS. 7, 8 and 9 are digital photographs of a portion of three other embodiments of micromachined infrared detector arrays of this invention. These figures are top views just as that of FIG. 4, however, the length or larger dimension of the detector is vertically oriented in FIGS. 7–9 whereas in FIG. 4 the length is horizontally oriented. In each of these three arrays a silicon nitride membrane is connected to the silicon substrate at the top and bottom of the detectors, however, for the arrays of FIGS. 7–9, because of certain gaps incorporated in these embodiments, only a very small part of the membrane of each of the detectors is connected to the substrate. In these particular embodiments, the silicon nitride membrane has a total thickness of about 0.6 μm due to the upper and lower silicon nitride layers plus the thickness of the thermoelectric elements where present. The detectors of FIGS. 7–9 are smaller and are more appropriate for scanned imaging applications than the array of FIG. 4. For the arrays of FIGS. 7 and 9 each detector has one Bi—Te/Bi—Sb—Te thermocouple. For the array of FIG. 8 each detector has a thermopile of five Bi—Te/Bi—Sb—Te thermocouples connected in series.

Referring to FIG. 7, an array, generally designated by numeral 75, has a plurality of detectors 76 separated from each other by a plurality of slits 77, which appear as dark vertical lines in the photograph of FIG. 7 along the perimeter of each detector. Slits 77 extend through both upper and lower silicon nitride layers of the membrane and enhance thermal isolation of hot junction halves 83 of each detector 76 from the hot junction halves of other detectors in array 75.

To enhance thermal isolation of detectors 76 from the substrate 78 each detector also has four upper and four lower horizontal gaps 79 which intersect vertical slits 77 and which appear as dark horizontal lines in the photograph of FIG. 7 along the top and bottom perimeter of each detector. Gaps 79 also extend through both upper and lower silicon nitride layers of the membrane and intersect, in alternating order, one of slits 77. Therefore, only two small areas of the membrane, near the cold junction halves 82, have not been cut through and those small areas are all that attaches the membrane to the substrate. This is also true for each of the detectors of the arrays of FIGS. 8 and 9.

For each detector in FIG. 7, a thermoelectric line 80 is formed at the top of the detector and a thermoelectric line 81 is formed at the bottom as shown in FIG. 7. Thermoelectric lines 80 and 81 appears as the lighter gray lines in the photograph.

To enhance thermal isolation of the hot junction means of the detector from the substrate each of lines 80 and 81 has three horizontal segments which snake between the right and left sides of the detector to increase the length of each line. Each snaking segment of each thermoelectric line is separated from its other segments by gaps 79 which generally appear as dark lines in FIG. 7.

A gold interconnect layer 84 connects each hot junction half 83 thereby forming hot junction means. Interconnect layer 84 also forms thin film wires for electrical connection to external electronics as shown on the top and bottom of FIG. 7. Gaps 79 and the extended length of thermoelectric lines 80 and 81, enhance the thermal isolation of hot junction halves 83 of detectors 76 from the substrate 78. Hot junction halves 83 form hot junction means and cold junction halves 82 form cold junction means.

Therefore, in the embodiment of this invention illustrated by the partial highly magnified view of FIG. 7 there is seen about six detectors and each detector 76 is separated from neighboring detectors by a 4 μm wide slit 77. Each detector 76 is supported by a 100 μm wide and 184 μm long thin membrane. Each of the detectors has thermoelectric lines 80 and 81 each of which comprise a half hot junction 83 and a half cold junctions 82. Thermoelectric line 80 is made from thermoelectric material "A" while thermoelectric lines 81 is made from thermoelectric material "B". The ratio of detector width to detector pitch for the array of FIG. 8 is 100 μm/104 μm or 0.96.

Referring to FIG. 8, an array, generally designated by numeral 87, has a plurality of detectors 88 separated from each other by a plurality of slits 89, which appear as dark vertical lines in the photograph of FIG. 8 along the perimeter of each detector. Slits 89 extend through both upper and lower silicon nitride layers of the membrane and enhance thermal isolation of the hot junctions 95 each detector 88 from the hot junctions of other detectors in array 87.

To enhance thermal isolation of detectors 88 from the substrate 90 each detector also has two upper and two lower horizontal gaps 91 which intersect vertical slits 89 and which appear as dark horizontal lines in the photograph of FIG. 8 along the upper and lower perimeter of each detector. Gaps 91 also extend through both upper and lower silicon nitride layers and intersect, in alternating order, one of slits 89.

For each detector 88, thermoelectric lines 92 and 93 are formed at the top and bottom, respectively, as shown in FIG. 8. Thermoelectric lines 92 and 93 appears as lighter, sometimes white, lines in the photograph. Each of lines 92 and 93 has one horizontal segment and two vertical segments on opposite sides of the horizontal segment to increase the length of each line. Each thermoelectric line is separated from the other lines by silicon nitride which generally appears as dark lines. Gaps 91 and the extended length of lines 92 and 93, enhance thermal isolation of hot junction means 95 of each of the detectors 88 from the substrate 90. A gold interconnect layer 96 connects the two hot junction halves of hot junction means 95. Hot junction means 95 comprises five hot junctions and cold junction means 97 comprises five cold junctions. Interconnect layer 96 also forms thin film wires for electrical connection to external electronics as shown on the top and bottom of FIG. 8.

Therefore, in the embodiment of this invention illustrated by the partial highly magnified view of FIG. 8 there is seen about six detectors and each detector 88 is separated from neighboring detectors by a 4 μm wide slit 89. Each detector 88 is supported by a 100 μm wide and 176 μm long thin membrane. Each of the detectors has thermoelectric lines 92 and 93 each of which comprise 2.5 hot junctions 95 and 2.5 cold junctions 97. Thermoelectric line 92 is made up of thermoelectric materials "A" and "B" in the following order: ABABA, while thermoelectric line 93 is made up of thermoelectric materials "A" and "B" in the following order: BABAB. The ratio of detector width to detector pitch for the array of FIG. 8 is 100 μm/104 μm or 0.96.

Referring to FIG. 9, an array, generally designated by numeral 100, has a plurality of detectors 101 separated from each other by a plurality of slits 102, which appear as dark vertical lines in the photograph of FIG. 9 along the perimeter of each detector. Slits 102 extend through both upper and lower silicon nitride layers of the membrane and enhance thermal isolation of the hot junction halves 108 of each detector 101 from the hot junction halves of other detectors in array 100.

To enhance thermal isolation of detectors 101 from the substrate 103 each detector also has two upper and two lower horizontal gaps 104 which intersect vertical slits 102 and which appear as dark horizontal lines in the photograph of FIG. 9 along the upper and lower perimeter of each detector. Gaps 104 also extend through both upper and lower silicon nitride layers of the membrane and intersect, in alternating order, one of slits 102.

For each detector 101, a thermoelectric line 105 is formed at the top of the detector and another thermoelectric line 106 is formed at the bottom as shown in FIG. 9. Thermoelectric lines 105 and 106 appears as lighter gray lines in the photograph.

To enhance thermal isolation of the hot junction means of the detector from the substrate each of lines 105 and 106 has one horizontal segment and two vertical segments on opposite sides of the horizontal segment to increase the length of each line.

Gaps 104 and the extended length of thermoelectric lines 105 and 106, enhance the thermal isolation of hot junction halves 108 of detectors 101 from the substrate 103. Hot junction halves 108 form hot junction means and cold junction halves 110 form cold junction means. Gold interconnect layer 109 connects each hot junction half 108 thereby forming hot junction means. Interconnect layer 109 also forms thin film wires for electrical connection to external electronics as shown on the top and bottom of FIG. 9.

Therefore, in the embodiment of this invention illustrated by the partial highly magnified view of FIG. 9 there is seen five detectors and each detector 101 is separated from neighboring detectors by a 4 μm wide slit 102. Each detector 101 is supported by a 50 μm wide, 70 μm long, and 0.6 μm thick silicon nitride membrane. Each of the detectors has thermoelectric lines 105 and 106 each of which comprise a half hot junction 108 and a half cold junction 110. Thermoelectric line 105 is made from thermoelectric material "A" while thermoelectric line 106 is made from thermoelectric material "B". The ratio of detector width to detector pitch for the array of FIG. 9 is 50 μm/54 μm or 0.93.

Geometry and measured performance of the four types of arrays shown in FIGS. 4 and 7–9 are presented in TABLE 2. Responsivity, response time, D* and $M_2$ values are given for devices under vacuum at room temperature. The values for the array of FIG. 4 represent average values of all detectors in two 63-element linear arrays.

For array of FIGS. 7–9, the measured values represent averages of the detectors in the arrays. The number of detectors represented in the averages is shown in Table 2.

The noise in the detectors of FIG. 4 was measured carefully for frequencies as low as 20 mHz, and only Johnson noise was seen. For the detectors of FIGS. 7–9 the noise was not measured, and D* was calculated with the assumption that only Johnson noise is present.

Figure 10:
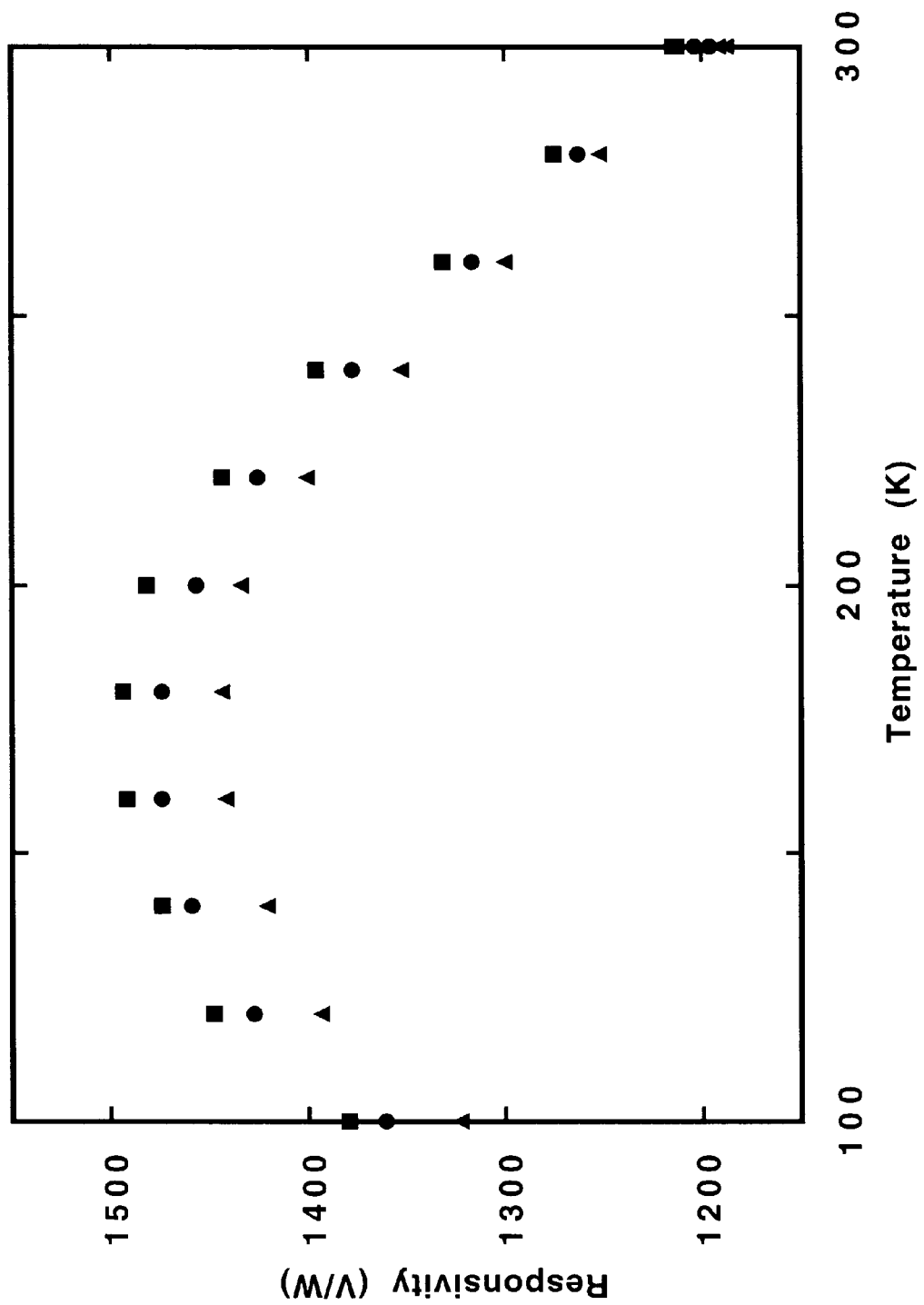
FIG. 10 is a graph of responsivity as a function of substrate temperature for three micromachined detectors in the array of FIG. 4.
Figure 11:
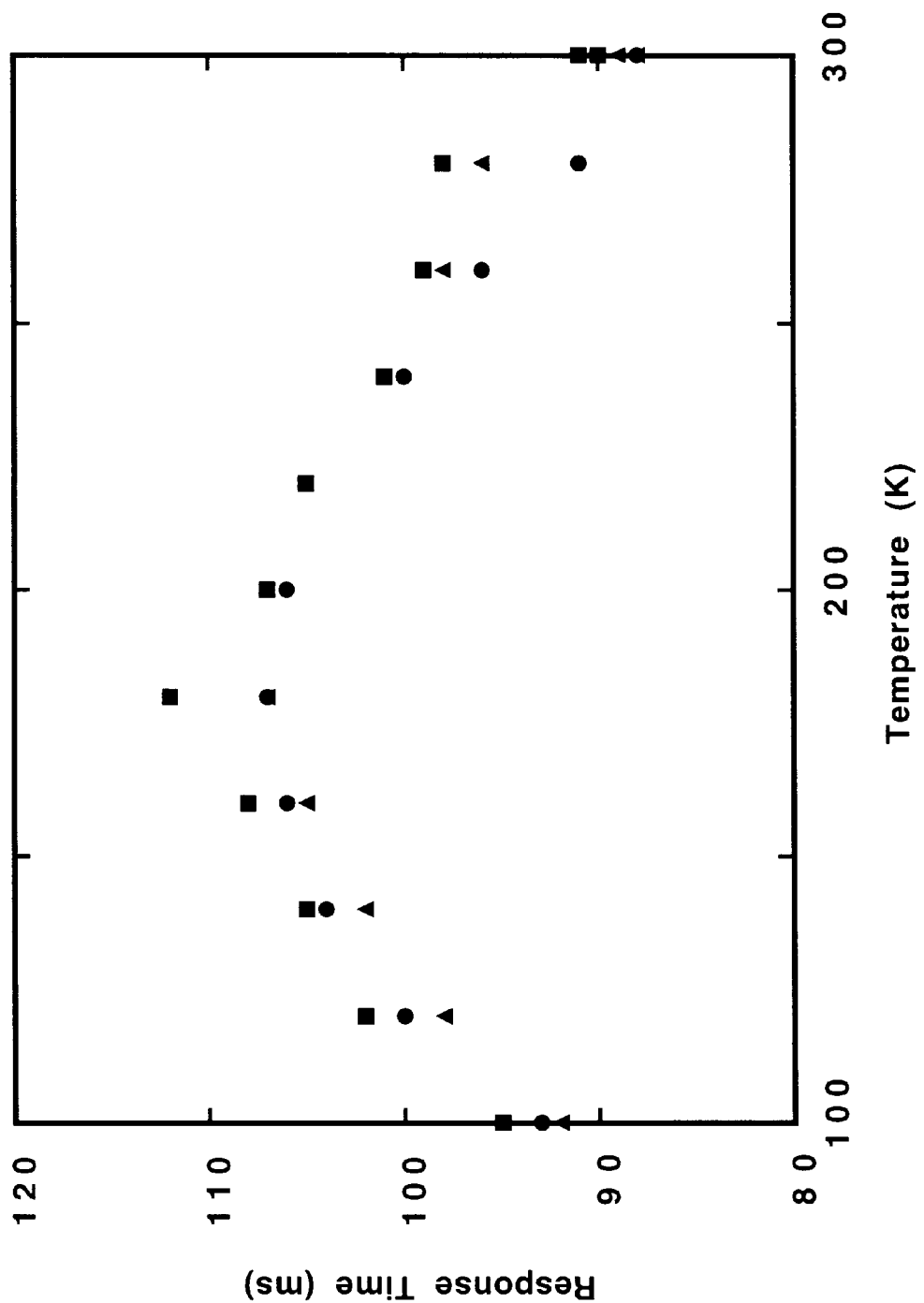
FIG. 11 is a graph of response time as a function of substrate temperature for three micromachined detectors in the array of FIG. 4.

For many applications, it is desirable for the detector responsivity and response time to have a small temperature dependence. FIGS. 10 and 11 show the responsivity and response time for three detectors of this invention in the same array as a function of substrate temperature. Data points for the first, second and third detectors, which were selected arbitrarily, are shown by squares, circles and triangles, respectively. These three detectors are from other arrays which are identical to the array shown in FIG. 4. These detectors are somewhat more responsive and faster than the array represented in Tables 1 and 2. Over the range 100–300 K, the total change in both responsivity and response time is about 20%. The detector resistance decreases by about 34% with decreasing temperature over the same range. The weak temperature dependence of the responsivity and response time are due to a balance between changes in thermal and electrical properties with temperature. In general, as the detector temperature is decreased, the membrane becomes more thermally isolated as the silicon nitride thermal conductivity and radiative heat loss both decrease. Decreases in the thermocouple Seebeck coefficient and silicon nitride specific heat with decreasing temperature roughly balance out these effects, resulting in a fairly constant responsivity and response time. Furthermore, in this invention if the detector size is reduced, radiation effects become a small fraction of the total thermal losses. The temperature dependence of the thermal isolation in smaller detectors is thus dominated by the more slowly varying silicon nitride thermal conductivity. As a result, both the responsivity and response time of smaller detectors increase more dramatically with decreasing temperature.

Figure 12:
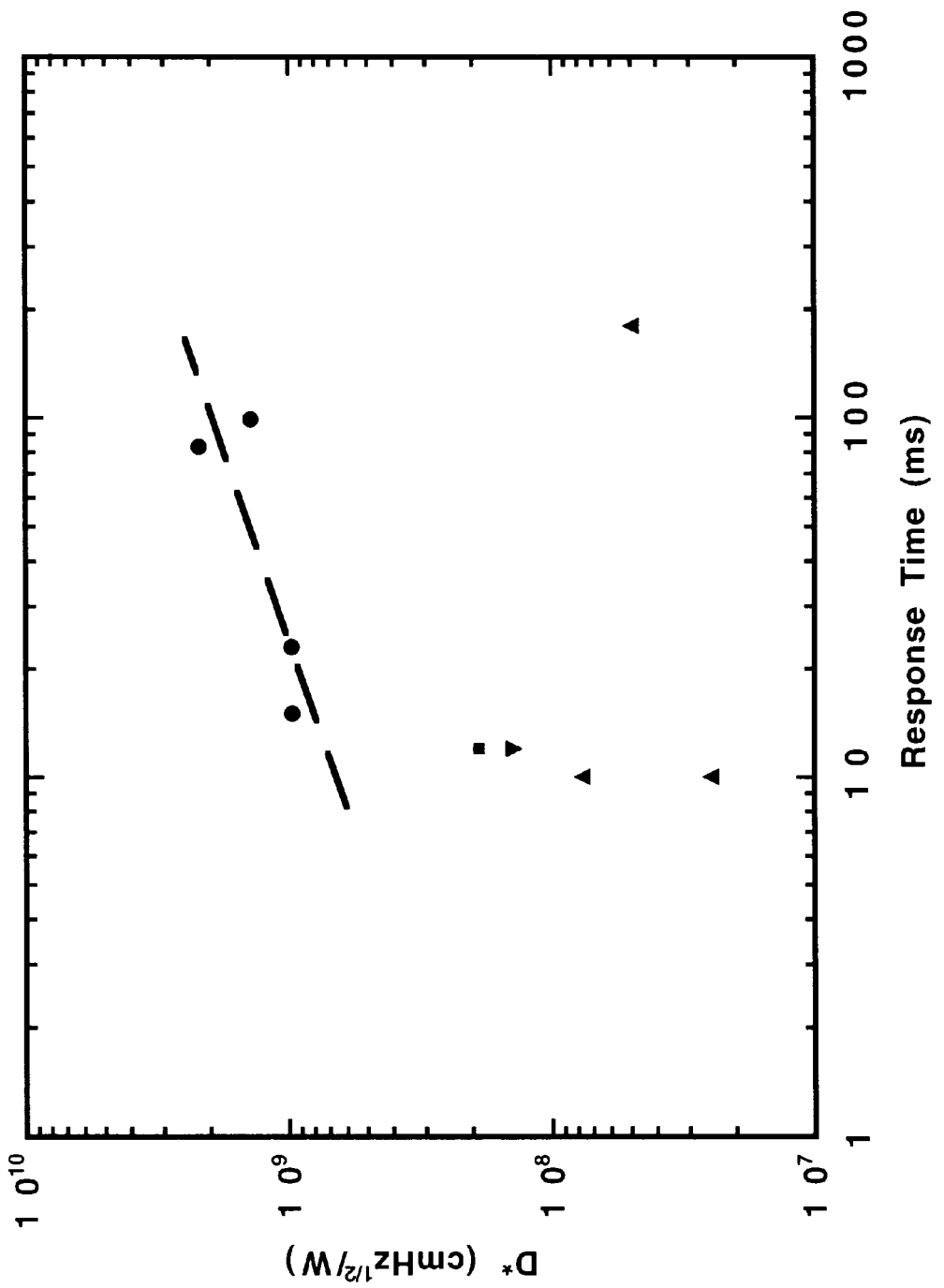
FIG. 12 is a graph of our data compared to representative data from the literature showing reported D* values as a function of response time for thin film thermopile linear arrays.

A comparison of the detectors and arrays produced in our work with that of micromachined thermopile linear arrays produced by others is shown in FIG. 12. The slope of the dashed line in FIG. 12, which represents our results, indicates that D* is proportional to the square root of response time, which is typical for thermopiles or bolometers made with different geometries but using the same material system and construction {Ref. 12,19}.

In FIG. 12, the thermoelectric materials, symbols and references are as follows:

Bi—Te/Bi—Sb—Te—Solid circular dots—our data;
Constantan/Chromel—Inverted Triangle {Ref. 13,14};
Silicon—Upright Triangles {Ref. 3,4,5}; and
BiSb/Sb—Squares {Ref. 23}.

Data is not included for 2-dimensional arrays made with polysilicon thermoelectrics {Ref. 6,7} due to lack of information on D* in those references.

Despite differences in geometry, fabrication, and testing procedures between the various arrays shown in FIG. 12, there is a clear dependence of D* on thermoelectric materials. Typically for thermocouple and thermopile detectors D* is proportional to the square root of the thermoelectric figure of merit Z {Ref. 12}, defined as the square of the Seebeck coefficient divided by both the electrical resistivity and the thermal conductivity. This relationship roughly holds for detectors in which a large fraction of the heat flow from the absorber occurs through the thermoelectric materials. For many thin film thermopile detectors, however, the support structure (membrane) provides a dominant part of the heat conduction path, so the dependence of D* on Z is weaker. The upright triangles in FIG. 12 indicate thermopiles made with doped crystalline silicon or polysilicon. These material systems are the most manufacturable, and should lead to the least costly commercial products. However, Z for silicon and polysilicon is relatively low (up to $4 \times 10^{-5}$ $K^{-1}$) {Ref. 11} and the performance of detectors with silicon thermoelectrics is only moderate. It should be noted that the D* values for silicon detectors shown in FIG. 12 were measured in argon or air, while the other detectors in this plot were measured in vacuum. A better comparison might result if all detectors were tested under vacuum. The inverted triangle, with slightly higher D*, represents arrays utilizing constantan and chromel metal film thermoelectrics, which have a somewhat higher Z value ($1 \times 10^{-4}$ K$^{-1}$). The solid circular dots are our data for our Bi—Te/Bi—Sb—Te detectors. This class of materials has Z values as high as $3 \times 10^{-3}$ K$^{-1}$.

Figure 13:
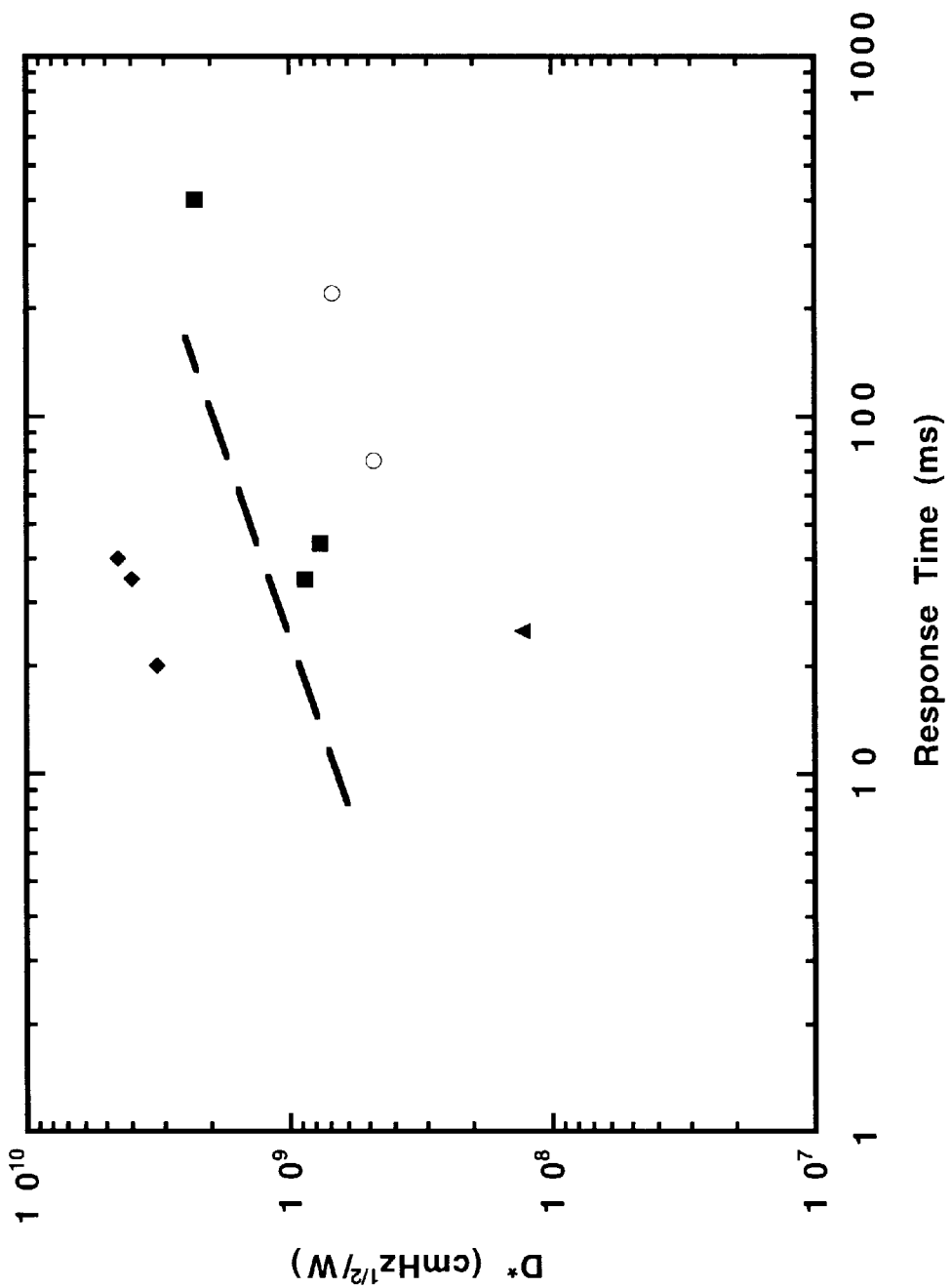
FIG. 13 is a graph of our data compared to representative data from the literature showing reported D* values as a function of response time for several thermocouple and thermopile detectors.

FIG. 13 shows D* versus response time for representative single thermocouple and single thermopile detectors reported in the literature. In FIG. 13 the thermoelectric materials, symbols and references are as follows:

Single Schwartz type thermocouple detectors—Diamonds {Ref. 15,16,24};

Single thin film thermopile detectors using bismuth based materials—Squares {Ref. 17,26};

Single thin film GaAs-AlGaAs thermopile detectors—Open Circles {Ref. 21}; and

Single thin film Si-based thermopile detectors—Triangle {Ref. 27}.

The dashed line, transposed from FIG. 12, represents our results. Again, the D* values are grouped according to materials used. The upright triangle is a single silicon thermopile detector. The circles represent detectors with thermoelectric elements of GaAs/AlGaAs, which has a thermoelectric figure of merit of about $5 \times 10^{-5}$ K$^{-1}$ {Ref. 21}. The squares represent single thin film thermopile detectors with thermocouples composed of Bi/Sb, Bi—Sb—Te/Bi—Sb, and BiSbTe+/BiSbTe–. The performance of these bismuth-based single detectors is in the same range as the arrays of this invention. Significantly higher in performance are the Schwartz type thermocouples, represented by diamonds in FIG. 13. These detectors are made from pins of bulk Bi—Te and Bi—Sb—Te materials with a blackened gold foil welded across them. The performance of Schwartz thermocouples is probably the highest of any uncooled thermal detector. However, these detectors are fragile, not easily arrayable, and due to their low resistance must be chopped and transformer coupled to achieve low-noise performance.

The difference in performance between our arrays and the Schwartz type thermocouple detectors is predominantly due to three factors. First, the absorption of the silicon nitride and platinum absorber of our devices is only about 50%, compared to roughly 100%for the blackened Schwartz detectors. Secondly, the figure of merit, Z, of the bulk thermoelectric materials in Schwartz detectors is higher than that of our thin films. The Schwartz thermocouple materials are grown as single crystals under optimal conditions. For example, the art {Ref. 15} reports a combined Z for the two materials of $3.1 \times 10^{-3}$ K$^{-1}$. The thermal conductivity of our films was not measured, however, one can estimate Z for these films by using measured values of the Seebeck coefficient and electrical conductivity, combined with a typical Bi—Te and Bi—Sb—Te Lorenz number of $6 \times 10^{-8}$ W/K$^2$ {Ref. 17,22}. The resulting Z of roughly $1 \times 10^{-3}$ K$^{-1}$ for our films is about a factor of three lower than the best bulk materials. Thus the difference in Z accounts for a factor of square root of three in D* between our arrays and the best Schwartz thermocouples.

A third reason for this difference in D* values is that our detectors have significant thermal losses through the silicon nitride support structures. The thermal conductance from the absorber for our detectors shown in FIG. 4 is estimated to be $1.7 \times 10^{-7}$ W/K for the thermoelectric lines, $6.5 \times 10^{-7}$ W/K due to radiation, and $6.7 \times 10^{-7}$ W/K through the silicon nitride support structure. An optimized detector will have no thermal link through the support structure, and equal values of thermal conductance through the thermoelectric materials and due to radiation. Theoretically, the silicon nitride could be removed from the lines of the detectors shown in FIG. 4. Then, the cross section of thermoelectric material could be increased to provide a thermal conductance of $6.7 \times 10^{-7}$ W/K, matching that due to radiation. The resulting total thermal conductance would be roughly the same as its current value, so the responsivity of the detectors would not change significantly. However, the detector resistance would decrease by about a factor of 3.9, decreasing the noise and increasing D* by about a factor of 2.

Thus, the combination of an imperfect absorber, lower Z value, and the parasitic thermal losses through the silicon nitride membrane easily explain the factor of 3.5 difference in performance between our thin film arrays and the Schwartz type thermocouple detectors.

Figure 14:
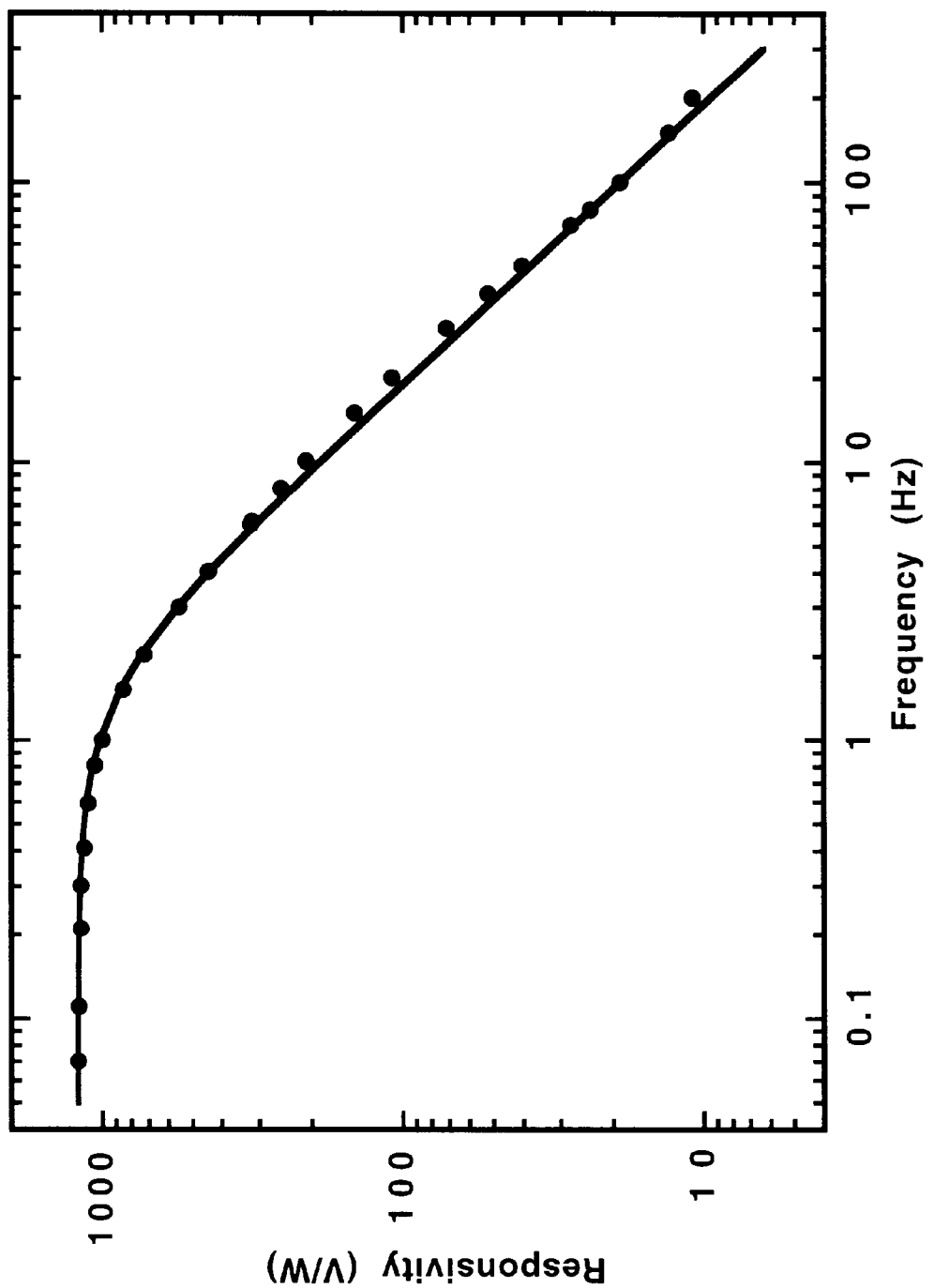
FIG. 14 is a graph of measured values of responsivity versus chopping frequency for the detector shown in FIG. 4 of this invention.

The frequency response of our detector shown in FIG. 4 was measured as a function of chopping frequency and is illustrated by the graph in FIG. 14. The solid line in FIG. 14 represents $R/(1+(2\pi f \tau)^2)^{1/2}$, where R is the measured dc responsivity, f is the chopping frequency, and $\tau$ is the measured thermal response time. The dc infrared responsivity was determined by measuring the change in detector output as the shutter in front of the blackbody aperture was opened and closed. The thermal response time was measured by closing a fast shutter in front of the blackbody and monitoring the decay of the detector output. This decay was exponential out to several 1/e times. The data points in FIG. 14 closely match the predicted curve.

Figure 15:
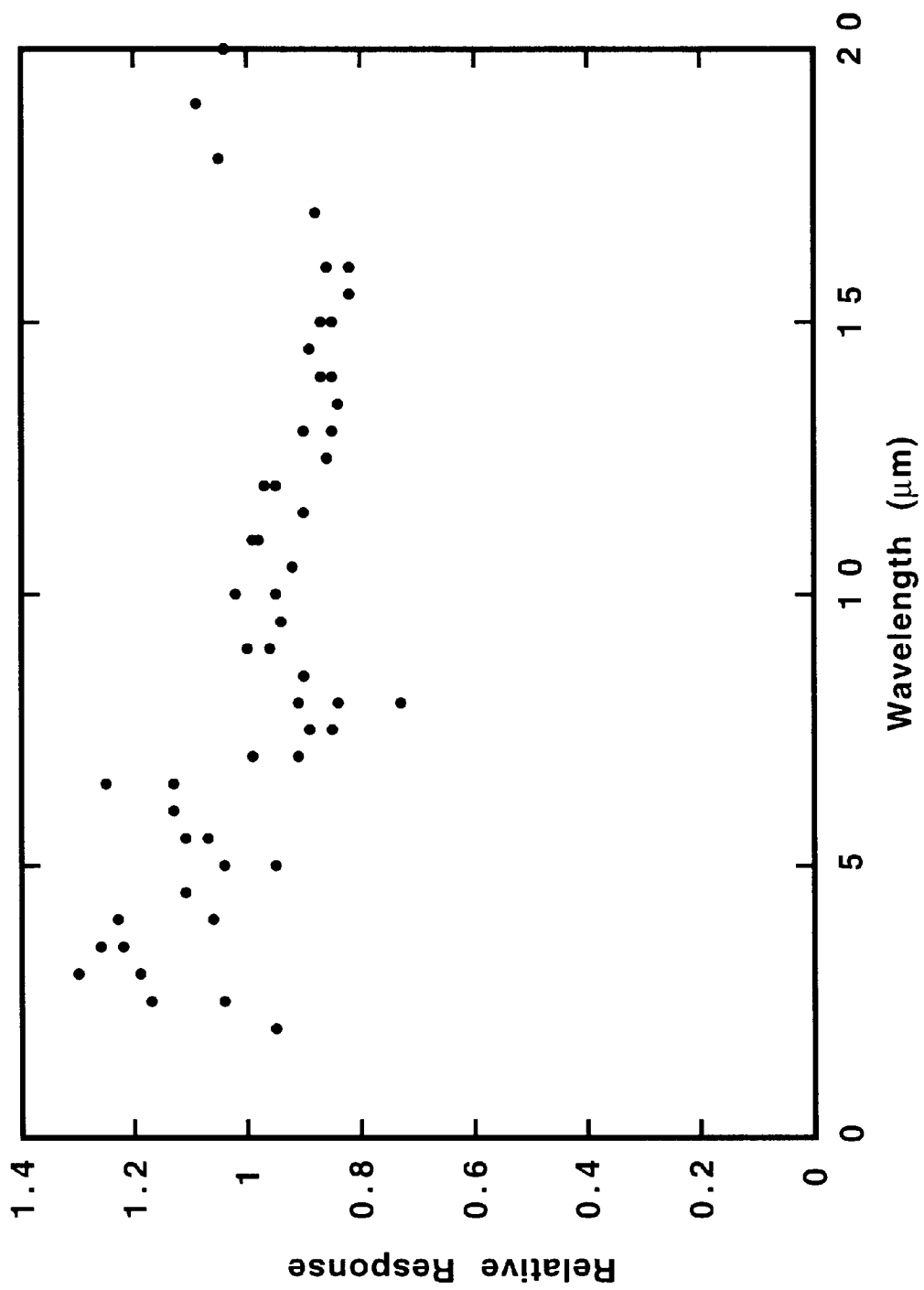
FIGS. 15 and 16 are graphs of relative spectral response curves for our detectors shown in FIG. 4 from two different wafers.
Figure 16:
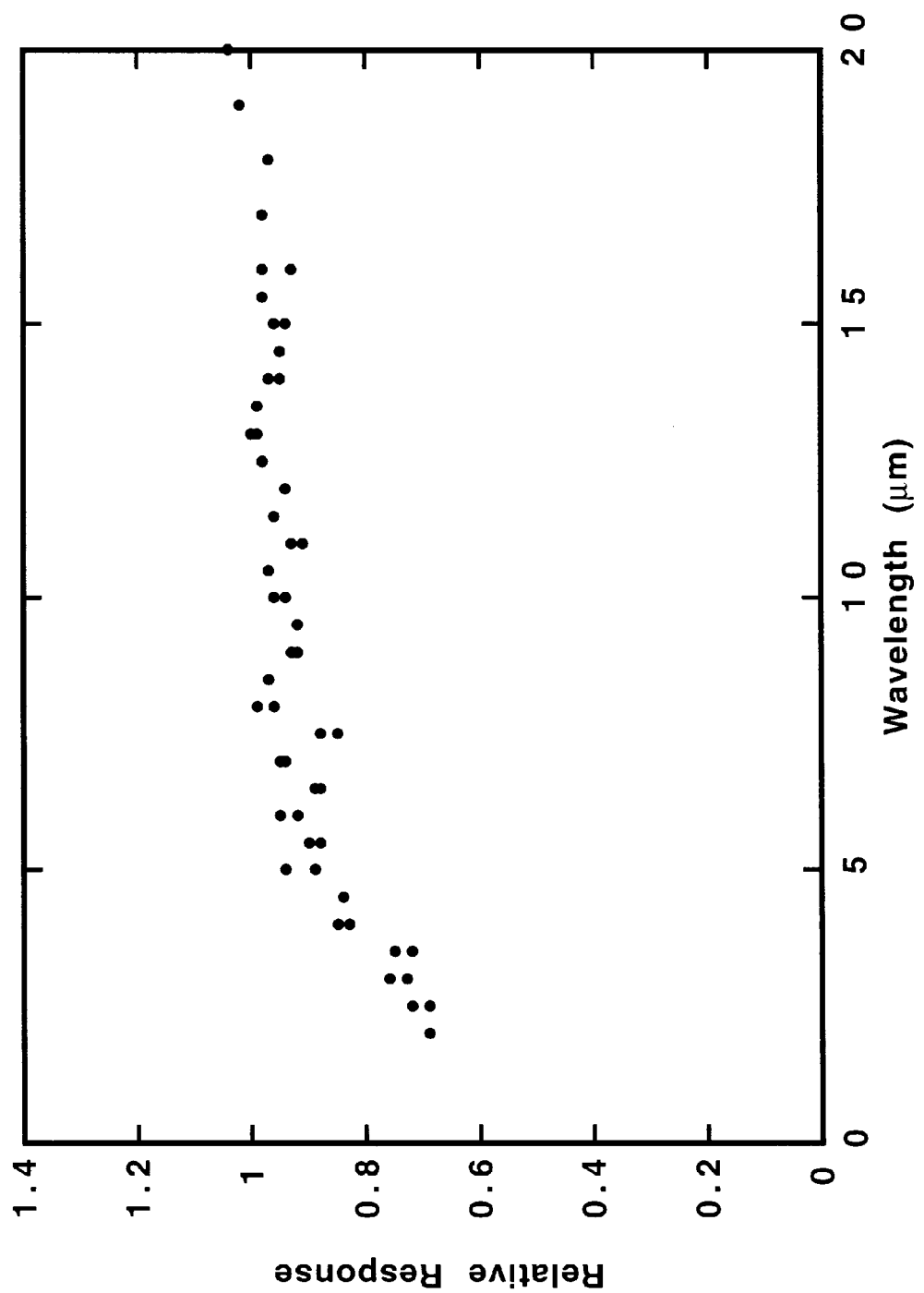

FIGS. 15 and 16 show the spectral response for two detectors from different wafers from arrays like that of FIG. 4. The radiation from a glow bar passed through a grating monochromator; unwanted diffraction orders were eliminated with a high pass filter. The monochromatic beam was split, with part going to the detector under test and part to a blackened pyroelectric detector. To increase the thermopile detector absorption, a thin layer of platinum with resistance approximately 200 $\Omega$/square was deposited on the backside of the membranes. Both thermopile detectors shown in FIGS. 15 and 16 have fairly flat broadband response. The difference in wavelength dependence between FIGS. 15 and 16 is probably due to silicon nitride and platinum thickness differences between the two wafers.

Although the detectors and arrays of this invention are especially useful for measuring infrared radiation, it should be understood that they are also broadband devices which are useful at a much larger wavelength range than merely the infrared. Furthermore, the micromachining process for creating the opening or window is also useful for producing other thermal detectors including but not limited to bolometers and pyroelectric detectors that have thermoelectric materials that are sensitive to silicon etchants.

While the preferred embodiments of the present invention have been described, it should be understood that various changes, adaptations and modifications may be made thereto without departing from the spirit of the invention and the scope of the appended claims. It should be understood, therefore, that the invention is not to be limited to minor details of the illustrated invention shown in preferred embodiment and the figures, and that variations in such minor details will be apparent to one skilled in the art.

Therefore, it is to be understood that the present disclosure and embodiments of this invention described herein are for purposes of illustration and example and that modifications and improvements may be made thereto without departing from the spirit of the invention or from the scope of the claims. The claims, therefore, are to be accorded a range of equivalents commensurate in scope with the advances made over the art.

TABLE 1

| Parameters For Array of FIG. 4 | Value |
|---|---|
| Detector Length ($\mu$m) | 1,500 |
| Detector Width ($\mu$m) | 71 |
| Detector Pitch ($\mu$m) | 75 |
| Ratio of detector width to detector pitch | 0.95 |
| Number of Thermocouples per Detector | 11 |
| Seebeck Coefficient for one Thermocouple ($\mu$V/K) | 300 |
| Resistance ($\Omega$) | 40,000 |
| dc Infrared Responsivity (V/W) | 1,100 |
| Standard Deviation of Infrared Responsivity | ±4.4% |
| dc Electrical Responsivity (V/W) | 2,230 |
| Response Time (ms) | 99 |
| D* (1000 K, 0 Hz) (cmHz$^{1/2}$/W) | $1.4 \times 10^9$ |
| Absorptivity | 0.5 |
| Thermal Conductance (W/K) | $1.5 \times 10^{-6}$ |
| Heat Capacity (J/K) | $1.5 \times 10^{-7}$ |

TABLE 2

| | TYPES OF DETECTORS | | | |
|---|---|---|---|---|
| PARAMETER | FIG. 4 | FIG. 7 | FIG. 8 | FIG. 9 |
| Detector Length ($\mu$m) | 1,500 | 184 | 176 | 70 |
| Detector Width ($\mu$m) | 71 | 100 | 100 | 50 |
| Detector Pitch ($\mu$m) | 75 | 104 | 104 | 54 |
| Ratio of detector width to detector pitch | 0.95 | 0.96 | 0.96 | 0.93 |
| Width of Gaps ($\mu$m) | none | 4 | 4 | 4 |
| Number of Thermocouples per Detector | 11 | 1 | 5 | 1 |
| No. of Detectors tested | 126 | 21 | 31 | 19 |
| Resistance ($\Omega$) | 40,000 | 2,900 | 12,000 | 1,650 |
| dc Infrared Responsivity (V/W) | 1,100 | 1,120 | 1,060 | 866 |
| Response Time (ms) | 99 | 83 | 23 | 15 |
| D* (1000 K, O Hz) × ($10^8$ cmHz$^{1/2}$/W) | 14 | 22 | 9.8 | 9.7 |
| M2 | 0.27 | 0.46 | 0.39 | 0.48 |

What is claimed is:

1. A micromachined thermoelectric array comprising:
   a plurality of spaced apart thermoelectric detectors, each detector having a thin dielectric membrane which includes at least one thermocouple having thermoelectric lines that form hot junction means for sensing a source radiation and cold junction means for sensing a reference temperature associated signal, the thermoelectric lines being formed from compositions selected from the group consisting of antimony, bismuth, selenium, tellurium and mixtures thereof;
   means for enhancing thermal isolation of the hot junction means of each detector from the hot junction means of the other detectors; and
   a micromachined substrate for supporting the thin dielectric membrane such that the substrate is opposite the cold junction means but not opposite the hot junction means so that there is an opening in the substrate opposite the hot junction means, and
      wherein the array has a high ratio of detector width to detector pitch opposite the opening in the substrate of the array, and wherein the high ratio of detector width to detector pitch is at least about 0.65.

2. The micromachined thermoelectric array of claim 1, wherein the high ratio of detector width to detector pitch is from about 0.80 to about 0.99.

3. The micromachined thermoelectric array of claim 1, wherein the means for enhancing thermal isolation of the hot junction means of each detector from the hot junction means of the other detectors includes slits having small widths on opposite sides of the detectors that extend through the thin dielectric membrane in a direction approximately perpendicular thereto, the small widths of the slits being small relative to the widths of the detectors.

4. The micromachined thermoelectric array of claim 1, further comprising means for enhancing thermal isolation of the hot junction means of each detector from the substrate.

5. The micromachined thermoelectric array of claim 1, wherein the thin dielectric membrane comprises two thin dielectric layers which sandwich therebetween the thermoelectric lines, the hot junction means and the cold junction means.

6. The micromachined thermoelectric array of claim 5, wherein the thermoelectric lines lie directly on one of the thin dielectric layers.

7. The micromachined thermoelectric array of claim 1, wherein the opening is also opposite a greater portion of the thermoelectric lines.

8. The micromachined thermoelectric array of claim 1, wherein the thin dielectric membrane further comprises a layer of radiation absorption material supported by the thin dielectric membrane opposite the opening in the substrate.

9. The micromnachined thermoelectric array of claim 1, further comprising means for electrically connecting the array to processing circuitry.

10. The micromachined thermoelectric array of claim 1, wherein each detector has one thermocouple.

11. The micromachined thermoelectric array of claim 1, wherein each detector has at least two thermocouples, and means for connecting the thermocouples in series.

12. The micromachined thermoelectric array of claim 1, wherein each detector has at least five thermocouples, and means for connecting the thermocouples in series.

13. The micromachined thermoelectric array of claim 1, wherein each detector has at least eleven thermocouples, and means for connecting the thermocouples in series.

14. The micromachined thermoelectric array of claim 1, wherein the number of the detectors is at least about 20.

15. The micromachined thermoelectric array of claim 1, wherein the number of the detectors is at least about 60.

16. The micromachined thermoelectric array of claim 1, wherein the number of the thermocouples is at least about 20.

17. The micromachined thermoelectric array of claim 1, wherein the number of the thermocouples is at least about 150.

18. The micromachined thermoelectric array of claim 1, wherein the number of the thermocouples is at least about 600.

19. The micromachined thermoelectric array of claim 1, wherein the detectors are arranged in a column.

20. A micromachined thermoelectric array comprising:
   a plurality of spaced apart thermoelectric detectors, each detector having a thin dielectric membrane which includes at least one thermocouple having thermoelectric lines that form hot junction means for sensing a source radiation and cold junction means for sensing a reference temperature associated signal, the thermoelectric lines being formed from compositions selected from the group consisting of antimony, bismuth, selenium, tellurium and mixtures thereof;

means for enhancing thermal isolation of the hot junction means of each detector from the hot junction means of the other detectors;

a micromachined substrate for supporting the thin dielectric membrane such that the substrate is opposite the cold junction means but not opposite the hot junction means so that there is an opening in the substrate opposite the hot junction means, and wherein the array has a high ratio of detector width to detector pitch opposite the opening in the substrate of the array; and further comprising for each detector two gaps having narrow widths near but on opposite sides of a perimeter of the opening in the substrate with the hot junction means therebetween, the gaps being approximately perpendicular to and extending through the thin dielectric membrane and into the opening in the substrate for enhancing thermal isolation of the hot junction means of the detector from the substrate, the narrow widths of the gaps being small relative to the widths of the detectors.

21. A micromachined thermoelectric array comprising:

a plurality of spaced apart thermoelectric detectors, each detector having a thin dielectric membrane which includes at least one thermocouple having thermoelectric lines that form hot junction means for sensing a source radiation and cold junction means for sensing a reference temperature associated signal, the thermoelectric lines being formed from compositions selected from the group consisting of antimony, bismuth, selenium, tellurium and mixtures thereof;

means for enhancing thermal isolation of the hot junction means of each detector from the hot junction means of the other detectors;

a micromachined substrate for supporting the thin dielectric membrane such that the substrate is opposite the cold junction means but not opposite the hot junction means so that there is an opening in the substrate opposite the hot junction means, and wherein the array has a high ratio of detector width to detector pitch opposite the opening in the substrate of the array, wherein the means for enhancing thermal isolation of the hot junction means of each detector from the hot junction means of the other detectors includes slits having small widths on opposite sides of the detectors that extend through the thin dielectric membrane in a direction approximately perpendicular thereto, the small widths of the slits being small relative to the widths of the detectors, and further comprising for each detector two gaps having narrow widths near but on opposite sides of a perimeter of the opening in the substrate with the hot junction means therebetween, the gaps being approximately perpendicular to and extending through the thin dielectric membrane and into the opening in the substrate for enhancing thermal isolation of the hot junction means of the detector from the substrate.

22. The micromachined thermoelectric array of claim 21, wherein at least a portion of one of the gaps is oriented at an angle to and intersects a slit on one of the sides of the detector and at least a portion of another of the gaps is oriented at an angle to and intersects another slit on the another side of the detector.

23. A micromachined thermoelectric array comprising:

a plurality of spaced apart thermoelectric detectors, each detector having a thin dielectric membrane which includes at least one thermocouple having thermoelectric lines that form hot junction means for sensing a source radiation and cold junction means for sensing a reference temperature associated signal, the thermoelectric lines being formed from compositions selected from the group consisting of antimony, bismuth, selenium, tellurium and mixtures thereof;

means for enhancing thermal isolation of the hot junction means of each detector from the hot junction means of the other detectors; and a micromachined substrate for supporting the thin dielectric membrane such that the substrate is opposite the cold junction means but not opposite the hot junction means so that there is an opening in the substrate opposite the hot junction means, and wherein the array has a high ratio of detector width to detector pitch opposite the opening in the substrate of the array, wherein the thin dielectric membrane comprises two thin dielectric layers which sandwich therebetween the thermoelectric lines, the hot junction means and the cold junction means, and wherein the thin dielectric membrane further comprises a thin adhesion layer between the thermoelectric lines and one of the thin dielectric layers.

24. A micromachined thermoelectric array comprising:

a plurality of spaced apart thermoelectric detectors, each detector having a thin dielectric membrane which includes at least one thermocouple having thermoelectric lines that form hot junction means for sensing a source radiation and cold junction means for sensing a reference temperature associated signal, the thermoelectric lines being formed from compositions selected from the group consisting of antimony, bismuth, selenium, tellurium and mixtures thereof;

means for enhancing thermal isolation of the hot junction means of each detector from the hot junction means of the other detectors;

a micromachined substrate for supporting the thin dielectric membrane such that the substrate is opposite the cold junction means but not opposite the hot junction means so that there is an opening in the substrate opposite the hot junction means, and wherein the array has a high ratio of detector width to detector pitch opposite the opening in the substrate of the array; and further comprising amplification means electrically connected to said each detector for low noise amplification of a signal from said each detector.

25. The micromachined thermoelectric array of claim 24, further comprising processing means for multiplexing the signals from the amplification means of the detectors.

26. A micromachined thermoelectric array comprising:

a plurality of spaced apart thermoelectric detectors, each detector having a thin dielectric membrane which defines a plane, the thin dielectric membrane including at least one thermocouple having thermoelectric lines that form hot junction means for sensing a source radiation and cold junction means for sensing a reference temperature associated signal, the thermoelectric lines being formed from compositions selected from the group consisting of antimony, bismuth, selenium, tellurium and mixtures thereof;

a micromachined substrate for supporting the thin dielectric membrane such that the substrate is opposite the cold junction means but not opposite the hot junction means so that there is an opening in the substrate opposite the hot junction means; and slits having small widths on opposite sides of the detectors, each slit being approximately perpendicular to the plane of the thin dielectric membrane and extending through the thin dielectric membrane and into the opening in the substrate for enhancing thermal isolation of the hot junction means of one detector from the hot junction means of a neighboring detector, the small widths of the slits being small relative to the widths of the detectors, and wherein the small widths of the slits are no greater than about 30 $\mu$m.

27. The micromachined thermoelectric array of claim 26 wherein the small widths of the slits are no greater than about 20 $\mu$m.

28. The micromachined thermoelectric array of claim 26 wherein the widths of the slits are no greater than about 10 $\mu$m.

29. The micromachined thermoelectric array of claim 26 wherein the widths of the slits are no greater than about 4 $\mu$m.

30. The micromachined thermoelectric array of claim 26, further comprising means for enhancing thermal isolation of the hot junction means of each detector from the substrate.

31. The micromachined thermoelectric array of claim 26, wherein the detectors are arranged in a column.

32. The micromachined thermoelectric array of claim 26, wherein the thin dielectric membrane comprises two thin dielectric layers which sandwich therebetween the thermoelectric lines, the hot junction means and the cold junction means.

33. The micromachined thermoelectric array of claim 26, wherein the thin dielectric membrane further comprises a layer of radiation absorption material supported by the thin dielectric membrane opposite the opening in the substrate.

34. A micromachined thermoelectric array comprising:

a plurality of spaced apart thermoelectric detectors, each detector having a thin dielectric membrane which defines a plane, the thin dielectric membrane including at least one thermocouple having thermoelectric lines that form hot junction means for sensing a source radiation and cold junction means for sensing a reference temperature associated signal, the thermoelectric lines being formed from compositions selected from the group consisting of antimony, bismuth, selenium, tellurium and mixtures thereof;

a micromachined substrate for supporting the thin dielectric membrane such that the substrate is opposite the cold junction means but not opposite the hot junction means so that there is an opening in the substrate opposite the hot junction means;

slits having small widths on opposite sides of the detectors, each slit being approximately perpendicular to the plane of the thin dielectric membrane and extending through the thin dielectric membrane and into the opening in the substrate for enhancing thermal isolation of the hot junction means of one detector from the hot junction means of a neighboring detector, the small widths of the slits being small relative to the widths of the detectors; and further comprising two gaps having narrow widths on opposite sides of the hot junction means and approximately perpendicular to the plane of the thin dielectric membrane and extending through the thin dialectric membrane into the opening of the substrate, the gaps for enhancing thermal isolation of the hot junction means of the detectors from the substrate.

35. The micromachined thermoelectric array of claim 34, wherein one gap being oriented at an angle to and intersecting the slit on one side of the detector and the other gap being oriented at an angle to and intersecting the slit on the opposite side of the detector.

36. A micromachined thermoelectric sensor comprising:

a detector having a thin dielectric membrane which defines a plane, the thin dielectric membrane including at least one thermocouple having thermoelectric lines that form hot junction means for sensing a source radiation and cold junction means for sensing a reference temperature associated signal, wherein the thermoelectric lines are formed from compositions selected from the group consisting of antimony, bismuth, selenium, tellurium and mixtures thereof;

a micromachined substrate for supporting the thin dielectric membrane such that the substrate is opposite the cold junction means but not opposite the hot junction means so that there is an opening in the substrate opposite the hot junction means; and two slits on opposite sides of the detector and approximately perpendicular to the plane of the thin dielectric membrane and extending therethrough for enhancing thermal isolation of the hot junction means of the detector from the substrate, wherein the two slits form a perimeter of the detector, and wherein the widths of the slits are no greater than about 30 $\mu$m.

37. A micromachined thermoelectric sensor comprising:

a detector having a thin dielectric membrane which defines a plane, the thin dielectric membrane including at least one thermocouple having thermoelectric lines that form hot junction means for sensing a source radiation and cold junction means for sensing a reference temperature associated signal, wherein the thermoelectric lines are formed from compositions selected from the group consisting of antimony, bismuth, selenium, tellurium and mixtures thereof;

a micromachined substrate for supporting the thin dielectric membrane such that the substrate is opposite the cold junction means but not opposite the hot junction means so that there is an opening in the substrate opposite the hot junction means;

two slits on opposite sides of the detector and approximately perpendicular to the plane of the thin dielectric membrane and extending therethrough for enhancing thermal isolation of the hot junction means of the detector from the substrate, wherein the two slits form a perimeter of the detector; and further comprising two gaps having narrow widths near but on opposite sides of a perimeter of the opening in the substrate with the hot junction means therebetween, the gaps being approximately perpendicular to and extending through the thin dielectric membrane and into the opening in the substrate for enhancing additional thermal isolation of the hot junction means of the detector from the substrate.

38. A process for forming a micromachined thermoelectric array comprising:

(a) providing a substrate having a frontside surface and a backside surface;

(b) forming an array having a plurality of detectors on the frontside surface of the substrate, each detector having a thin dielectric membrane which includes a plurality of patterned thin thermoelectric lines, hot junction means for sensing a source radiation and cold junction means for sensing a reference temperature associated signal, each detector being spaced apart from neighboring detectors by a small distance relative to widths of the detectors, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means; and (d) forming slits having small widths on opposite sides of the detectors in the array and through the thin dielectric membrane and into the opening of the substrate for enhancing thermal isolation of the hot junction means of each detector in the array from the hot junction means of the other detectors in the array, the small widths of the slits being small relative to widths of the detectors, and wherein the small distance that the detectors are spaced apart is small enough that the array has a high ratio of detector width to detector pitch opposite the opening in the substrate of the array, and wherein the high ratio of detector width to detector pitch is at least about 0.65.

39. The process of claim 38, wherein the thin dielectric membrane is formed by first forming a first thin dielectric layer on the frontside surface of the substrate;

followed by forming the plurality of thermoelectric lines and the hot and cold junction means on the first thin dielectric layer;

followed by forming a second thin dielectric layer on the plurality of thermoelectric lines and the hot and cold junction means and the first thin dielectric layer so that the plurality of thermoelectric lines and the hot and cold junction means are sandwiched between the first and second thin dielectric layers.

40. The process of claim 38, further comprising forming a radiation absorbing layer supported by the thin dielectric membrane at the opening.

41. A process for forming a micromachined thermoelectric array comprising:

(a) providing a substrate having a frontside surface and a backside surface;

(b) forming an array having a plurality of detectors on the frontside surface of the substrate, each detector having a thin dielectric membrane which includes a plurality of patterned thin thermoelectric lines, hot junction means for sensing a source radiation and cold junction means for sensing a reference temperature associated signal, each detector being spaced apart from neighboring detectors by a small distance relative to widths of the detectors, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means; and (d) forming slits having small widths on opposite sides of the detectors in the array and through the thin dielectric membrane and into the opening of the substrate for enhancing thermal isolation of the hot junction means of each detector in the array from the hot junction means of the other detectors in the array, the small widths of the slits being small relative to widths of the detectors, and wherein the small distance that the detectors are spaced apart is small enough that the array has a high ratio of detector width to detector pitch opposite the opening in the substrate of the array, and wherein the width of each slit is no greater than about 30 $\mu$m.

42. A process for forming a micromachined thermoelectric array comprising:

(a) providing a substrate having a frontside surface and a backside surface;

(b) forming an array having a plurality of detectors on the frontside surface of the substrate, each detector having a thin dielectric membrane which includes a plurality of patterned thin thermoelectric lines, hot junction means for sensing a source radiation and cold junction means for sensing a reference temperature associated signal, each detector being spaced apart from neighboring detectors by a small distance relative to widths of the detectors, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means;

(d) forming slits having small widths on opposite sides of the detectors in the array and through the thin dielectric membrane and into the opening of the substrate for enhancing thermal isolation of the hot junction means of each detector in the array from the hot junction means of the other detectors in the array, the small widths of the slits being small relative to widths of the detectors, and wherein the small distance that the detectors are spaced apart is small enough that the array has a high ratio of detector width to detector pitch opposite the opening in the substrate of the array; and (e) further comprising, for each detector in the array, forming two gaps having narrow widths near but on opposite sides of the opening in the substrate, with the hot junction means of the detector therebetween, the gaps being formed approximately perpendicularly to the thin dielectric membrane and extending through the thin dielectric membrane and into the opening in the substrate for enhancing thermal isolation of the hot junction means of the detectors from the substrate.

43. A process for forming a micromachined thermoelectric array comprising:

(a) providing a substrate having a frontside surface and a backside surface;

(b) forming an array having a plurality of detectors on the frontside surface of the substrate, each detector having a thin dielectric membrane which includes a plurality of patterned thin thermoelectric lines, hot junction means for sensing a source radiation and cold junction means for sensing a reference temperature associated signal, each detector being spaced apart from neighboring detectors by a small distance relative to widths of the detectors, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means;

(d) forming slits having small widths on opposite sides of the detectors in the array and through the thin dielectric membrane and into the opening of the substrate for enhancing thermal isolation of the hot junction means of each detector in the array from the hot junction means of the other detectors in the array, the small widths of the slits being small relative to widths of the detectors, and wherein the small distance that the detectors are spaced apart is small enough that the array has a high ratio of detector width to detector pitch opposite the opening in the substrate of the array;

(e) forming a plurality of said micromachined thermoelectric arrays on the frontside surface of the substrate;

(f) wherein the micromachining of the opening in the portion of the backside surface of the substrate further includes forming a groove in the substrate around each array for defining a boundary for each array and a scrap portion of the substrate; and (g) separating the arrays from each other and from the scrap portion of the substrate at the grooves.

44. The process of claim 43, further comprising, before separating the arrays from each other and from the scrap portion of the substrate, forming a radiation absorbing layer supported by the thin dielectric membrane at the opening of each array.

45. A process for forming a micromachined thermoelectric array comprising:

(a) providing a substrate having a frontside surface and a backside surface;

(b) forming an array having a plurality of detectors on the frontside surface of the substrate, each detector having a thin dielectric membrane which includes a plurality of patterned thin thermoelectric lines, hot junction means for sensing a source radiation and cold junction means for sensing a reference temperature associated signal, each detector being spaced apart from neighboring detectors by a small distance relative to widths of the detectors, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means; and (d) forming slits having small widths on opposite sides of the detectors in the array and through the thin dielectric membrane and into the opening of the substrate for enhancing thermal isolation of the hot junction means of each detector in the array from the hot junction means of the other detectors in the array, the small widths of the slits being small relative to widths of the detectors, and wherein the small distance that the detectors are spaced apart is small enough that the array has a high ratio of detector width to detector pitch opposite the opening in the substrate of the array, and wherein the micromachining of the opening in the portion of the backside surface of the substrate opposite the hot junction means but not opposite the cold junction means further comprises:

isolating the array of detectors in an etching jig that prevents attack by an operable etchant to the array of detectors except for an unprotected portion of the backside surface of the substrate, while the array of detectors is in the etching jig, treating the unprotected portion of the backside surface of the substrate with the operable etchant under conditions effective for removing the unprotected portion of the substrate, and stopping the treatment when the etchant reaches the thin dielectric membrane thereby completing the micromachining of the opening.

46. The process of claim 45, wherein the isolating of the array of detectors in the etching jig further comprises:

sealing and temporarily bonding a perimeter of the frontside surface of the substrate with a temporary bonding agent to an etchant-impermeable first plate; and sealing a perimeter of the backside surface of the substrate to an etchant-impermeable second plate having an opening facing the unprotected portion of the backside of the substrate.

47. The process of claim 45, wherein the isolating of the array of detectors in the etching jig further comprises:

sealing and temporarily bonding a perimeter of the frontside surface of the substrate with a temporary bonding agent to an etchant-impermeable first plate;

sealing a perimeter of the backside surface of the substrate to an etchant-impermeable second plate having an opening facing the unprotected portion of the backside of the substrate; and sealing the second plate to an etchant-impermeable cap that spans the etchant-impermeable first plate thereby providing means for preventing the etchant from contacting the temporary bonding agent.

48. A process for forming a micromachined thermoelectric sensor comprising:

(a) providing a substrate having a frontside surface and a backside surface, the frontside surface forming a plane;

(b) forming a detector on the frontside surface of the substrate, the detector having a thin dielectric membrane which includes a plurality of patterned thin thermoelectric lines, hot junction means for sensing a source radiation and cold junction means for sensing a reference temperature associated signal, wherein the thermoelectric lines are formed from compositions selected from the group consisting of antimony, bismuth, selenium, tellurium and mixtures thereof; thereafter (c) micromachining an opening in a portion of the backside surface of the substrate opposite the hot junction means but not opposite the cold junction means; thereafter and (d) forming two slits on opposite sides of the detector, approximately perpendicular to the plane of the frontside surface of the substrate and extending through the thin dielectric membrane for enhancing thermal isolation of the hot junction means of the detector from the substrate, wherein the two slits form a perimeter of the detector.

49. The process of claim 48, further comprising forming a radiation absorbing layer supported by the thin dielectric membrane at the opening.

50. A process for forming a micromachined thermoelectric sensor comprising:

(a) providing a substrate having a frontside surface and a backside surface, the frontside surface forming a plane;

(b) forming a detector on the frontside surface of the substrate, the detector having a thin dielectric membrane which includes a plurality of patterned thin thermoelectric lines, hot junction means for sensing a source radiation and cold junction means for sensing a reference temperature associated signal, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means;

(d) forming two slits on opposite sides of the detector, approximately perpendicular to the plane of the frontside surface of the substrate and extending through the thin dielectric membrane for enhancing thermal isolation of the hot junction means of the detector from the substrate, wherein the two slits form a perimeter of the detector; and (e) forming two gaps having narrow widths near but on opposite sides of the opening in the substrate, with the hot junction means of the detector therebetween, the gaps being formed approximately perpendicularly to the thin dielectric membrane and extending through the thin dielectric membrane and into the opening in the substrate for enhancing additional thermal isolation of the hot junction means of the detector from the substrate.

51. A process for forming a micromachined thermoelectric sensor comprising:

(a) providing a substrate having a frontside surface and a backside surface, the frontside surface forming a plane;

(b) forming a detector on the frontside surface of the substrate, the detector having a thin dielectric membrane which includes a plurality of patterned thin thermoelectric lines, hot junction means for sensing a source radiation and cold junction means for sensing a reference temperature associated signal, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means; and (d) forming two slits on opposite sides of the detector, approximately perpendicular to the plane of the frontside surface of the substrate and extending through the thin dielectric membrane for enhancing thermal isolation of the hot junction means of the detector from the substrate, wherein the two slits form a perimeter of the detector, and wherein the micromachining of the opening in the portion of the backside surface of the substrate further includes forming a groove in the substrate for defining a boundary for the detector and a scrap portion of the substrate, and separating the detector from the scrap portion of the substrate at the groove.

52. A process for forming a micromachined thermoelectric sensor comprising:

(a) providing a substrate having a frontside surface and a backside surface, the frontside surface forming a plane;

(b) forming a detector on the frontside surface of the substrate, the detector having a thin dielectric membrane which includes a plurality of patterned thin thermoelectric lines, hot junction means for sensing a source radiation and cold junction means for sensing a reference temperature associated signal, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means; and (d) forming two slits on opposite sides of the detector, approximately perpendicular to the plane of the frontside surface of the substrate and extending through the thin dielectric membrane for enhancing thermal isolation of the hot junction means of the detector from the substrate, wherein the two slits form a perimeter of the detector, and wherein the micromachining of the opening in the portion of the backside surface of the substrate opposite the hot junction means but not opposite the cold junction means further comprises:

isolating the detector in an etching jig operable for preventing attack by an operable etchant to the detector except for an unprotected portion of the backside surface of the substrate, while the detector is in the etching jig, treating the unprotected portion of the backside surface of the substrate with the operable etchant under conditions effective for removing the unprotected portion of the substrate, and stopping the treatment when the operable etchant reaches the thin dielectric membrane thereby completing the micromachining of the opening.

53. The process of claim 52, wherein the isolating of the detectors in the etching jig further comprises:

sealing and temporarily bonding a perimeter of the frontside surface of the substrate with a temporary bonding agent to an etchant-impermeable first plate; and sealing a perimeter of the backside surface of the substrate to an etchant-impermeable second plate having an opening facing the unprotected portion of the backside of the substrate.

54. A process for forming a micromachined thermoelectric sensor comprising:

(a) providing a substrate having a frontside surface and a backside surface, the frontside surface forming a plane;

(b) forming a detector on the frontside surface of the substrate, the detector having a thin dielectric membrane which includes a plurality of patterned thin thermoelectric lines, hot junction means for sensing a source radiation and cold junction means for sensing a reference temperature associated signal, wherein the thermoelectric lines are formed from compositions selected from the group consisting of antimony, bismuth, selenium, tellurium and mixtures thereof;

(c) micromachining an opening in a portion of the backside surface of the substrate opposite the hot junction means but not opposite the cold junction means; and (d) forming two slits on opposite sides of the detector, approximately perpendicular to the plane of the frontside surface of the substrate and extending through the thin dielectric membrane for enhancing thermal isolation of the hot junction means of the detector from the substrate, wherein the two slits form a perimeter of the detector and wherein the widths of the slits are no greater than about 30 $\mu$m.

55. A process for forming a micromachined thermoelectric sensor comprising:

(a) providing a substrate having a frontside surface and a backside surface, the frontside surface forming a plane, the frontside surface having a first thin dielectric layer thereover;

(b) forming a detector on the first thin dielectric layer which includes a plurality of patterned thin thermoelectric lines, hot junction means for sensing a source radiation and cold junction means for sensing a reference temperature associated signal, wherein the thermoelectric lines are formed from compositions selected from the group consisting of antimony, bismuth, selenium, tellurium and mixtures thereof; thereafter (c) forming a second thin dielectric layer over the thin thermoelectric lines and first thin dielectric layer, the first and second thin dielectric layer forming a thin dielectric membrane; thereafter (d) micromachining an opening in a portion of the backside surface of the substrate opposite the hot junction means but not opposite the cold junction means; and thereafter (e) forming two slits on opposite sides of the detector, approximately perpendicular to the plane of the frontside surface of the substrate and extending through the thin dielectric membrane for enhancing thermal isolation of the hot junction means of the detector from the substrate, wherein the two slits form a perimeter of the detector.

* * * * *